US008221965B2

(12) United States Patent
Yao et al.

(10) Patent No.: US 8,221,965 B2
(45) Date of Patent: Jul. 17, 2012

(54) ANTIREFLECTIVE COATING COMPOSITIONS

(75) Inventors: Huirong Yao, Plainsboro, NJ (US); Zhong Xiang, Orlando, FL (US); Jianhui Shan, Pennington, NJ (US); Salem Mullen, Florham Park, NJ (US); Hengpeng Wu, Hillsborough, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 12/133,562

(22) Filed: Jul. 8, 2008

(65) Prior Publication Data

US 2010/0009293 A1 Jan. 14, 2010

(51) Int. Cl.
G03F 1/58 (2012.01)
G03F 7/20 (2006.01)
C08G 69/00 (2006.01)

(52) U.S. Cl. ............... 430/325; 430/326; 430/272.1; 430/271.1; 430/312; 528/289; 528/288; 528/69; 528/361

(58) Field of Classification Search .................. None
See application file for complete search history.

(56) References Cited

U.S. PATENT DOCUMENTS

| | | | |
|---|---|---|---|
| 3,215,758 A * | 11/1965 | Hopkins | 525/49 |
| 3,279,940 A * | 10/1966 | Francis et al. | 428/483 |
| 3,448,084 A * | 6/1969 | Burdick et al. | 528/289 |
| 3,474,054 A | 10/1969 | White | |
| 3,476,718 A | 11/1969 | Vandenberg | |
| 3,477,996 A * | 11/1969 | Formaini Robert L | 528/289 |
| 3,711,391 A | 1/1973 | Feinberg | |
| 4,058,537 A | 11/1977 | Mueller | |
| 4,064,191 A | 12/1977 | Parekh | |
| 4,118,437 A | 10/1978 | Parekh | |
| 4,200,729 A | 4/1980 | Calbo | |
| 4,251,665 A | 2/1981 | Calbo | |
| 4,255,558 A | 3/1981 | Turpin | |
| 4,309,529 A * | 1/1982 | Wendling | 528/289 |
| 4,491,628 A | 1/1985 | Ito et al. | |
| 5,187,019 A | 2/1993 | Calbo et al. | |
| 5,350,660 A | 9/1994 | Urano et al. | |
| 5,380,804 A | 1/1995 | Lees et al. | |
| 5,693,691 A | 12/1997 | Flaim et al. | |
| 5,843,624 A | 12/1998 | Houlihan et al. | |
| 5,935,760 A | 8/1999 | Shao et al. | |
| 5,998,099 A | 12/1999 | Houlihan et al. | |
| 6,042,992 A | 3/2000 | Dammel et al. | |
| 6,132,926 A | 10/2000 | Jung et al. | |
| 6,165,684 A | 12/2000 | Mitsutani et al. | |
| 6,274,295 B1 | 8/2001 | Dammel et al. | |
| 6,323,310 B1 | 11/2001 | Puligadda et al. | |
| 6,447,980 B1 | 9/2002 | Rahman et al. | |
| 6,509,417 B1 | 1/2003 | Wetzel et al. | |
| 6,686,124 B1 | 2/2004 | Angelopoulos et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,081,511 B2 * | 7/2006 | Wu et al. | 528/272 |
| 7,264,913 B2 | 9/2007 | Wu et al. | |
| 7,332,266 B2 | 2/2008 | Kishioka et al. | |
| 7,416,834 B2 | 8/2008 | Abdallah et al. | |
| 7,470,500 B2 | 12/2008 | Yao et al. | |
| 7,553,905 B2 | 6/2009 | Abdallah et al. | |
| 7,638,262 B2 * | 12/2009 | Wu et al. | 430/271.1 |
| 7,691,556 B2 | 4/2010 | Wu et al. | |
| 2002/0076641 A1 | 6/2002 | Chol et al. | |
| 2003/0180559 A1 | 9/2003 | Wayton et al. | |
| 2003/0191203 A1 | 10/2003 | Oohara et al. | |
| 2003/0224283 A1 | 12/2003 | Allen et al. | |
| 2004/0072420 A1 | 4/2004 | Enomoto et al. | |
| 2004/0253203 A1 * | 12/2004 | Hossainy et al. | 424/78.08 |
| 2005/0019696 A1 | 1/2005 | Allen et al. | |
| 2005/0215713 A1 | 9/2005 | Hessell et al. | |
| 2006/0058468 A1 | 3/2006 | Wu et al. | |
| 2006/0134546 A1 | 6/2006 | Huang et al. | |
| 2006/0134547 A1 | 6/2006 | Huang et al. | |
| 2006/0210915 A1 | 9/2006 | Takei et al. | |
| 2006/0216652 A1 | 9/2006 | Kishioka et al. | |
| 2006/0234156 A1 | 10/2006 | Kishioka | |
| 2006/0275696 A1 | 12/2006 | Zampini et al. | |
| 2006/0290429 A1 | 12/2006 | Kishioka et al. | |
| 2007/0004228 A1 | 1/2007 | Hatanaka et al. | |
| 2007/0020557 A1 * | 1/2007 | Yao et al. | 430/270.1 |
| 2007/0042289 A1 | 2/2007 | Thackeray et al. | |
| 2007/0122740 A1 | 5/2007 | Hatakeyama et al. | |
| 2007/0141507 A1 | 6/2007 | Sakata et al. | |
| 2008/0038659 A1 | 2/2008 | Wu et al. | |
| 2008/0038678 A1 | 2/2008 | Kishioka et al. | |
| 2008/0175882 A1 * | 7/2008 | Trollsas et al. | 424/423 |

(Continued)

FOREIGN PATENT DOCUMENTS

| | | |
|---|---|---|
| CA | 1 204 547 A1 | 5/1986 |
| EP | 1 315 043 A1 | 5/2003 |
| EP | 1 560 070 A1 | 8/2005 |
| EP | 1 598 702 A1 | 11/2005 |
| EP | 1 705 519 A2 | 9/2006 |
| EP | 1 757 986 A1 | 2/2007 |
| EP | 1 939 688 A1 | 7/2008 |
| JP | 1-293339 A | 11/1989 |
| JP | 2004-14474 A | 1/2002 |
| WO | WO-2004/034148 A1 * | 4/2004 |
| WO | WO 2005/097883 A2 | 10/2005 |

OTHER PUBLICATIONS

Marvel et al "Polythiolesters", J. Am. Chem. Soc., vol. 73, No. (3), pp. 1100-1102. Year 1951.*
Form PCT/ISA/220, Form PCT/ISA/210, and Form PCT/ISA/237 for PCT/IB2009/005458 dated Aug. 4, 2009, which corresponds to U.S. Appl. No. 12/133,562.
Form PCT/ISA/220, Form PCT/ISA/210, and Form PCT/ISA/237 for PCT/IB2009/005486 dated Sep. 1, 2009, which corresponds to U.S. Appl. No. 12/133,567.
Office Action dated Jul. 31, 2009 for U.S. Appl. No. 11/836,980.
Office Action dated Nov. 3, 2009 for U.S. Appl. No. 11/836,980.
Form PCT/ISA/210 for PCT/IB2008/002132 mailed Mar. 3, 2009, which corresponds to U.S. Appl. No. 11/836,980.
Form PCT/IB/326, Form PCT/IB/373, and Form PCT/ISA/237 for PCT/IB2008/002132 dated Feb. 25, 2010, which corresponds to U.S. Appl. No. 11/836,980.

(Continued)

*Primary Examiner* — Cynthia Hamilton
(74) *Attorney, Agent, or Firm* — Alan P. Kass; Sangya Jain

(57) ABSTRACT

Antireflective coating compositions and related polymers are disclosed.

14 Claims, 1 Drawing Sheet

U.S. PATENT DOCUMENTS

| | | | |
|---|---|---|---|
| 2009/0035704 | A1 | 2/2009 | Zhuang et al. |
| 2009/0042133 | A1 | 2/2009 | Xiang et al. |
| 2009/0117493 | A1 | 5/2009 | Kishioka et al. |
| 2009/0246691 | A1 | 10/2009 | Rahman et al. |
| 2009/0274974 | A1 | 11/2009 | Abdallah et al. |
| 2009/0280435 | A1 | 11/2009 | McKenzie et al. |
| 2009/0311624 | A1 | 12/2009 | Horiguchi et al. |
| 2010/0009297 | A1 | 1/2010 | Yao et al. |
| 2010/0092894 | A1 | 4/2010 | Liu et al. |
| 2010/0256285 | A1* | 10/2010 | Zhao et al. ............... 524/507 |
| 2011/0104613 | A1 | 5/2011 | Yao et al. |
| 2011/0200938 | A1 | 8/2011 | Yao et al. |
| 2011/0250544 | A1 | 10/2011 | Liu et al. |

OTHER PUBLICATIONS

Office Action dated Mar. 19, 2010 for U.S. Appl. No. 12/133,567.
Office Action dated Mar. 10, 2010 for U.S. Appl. No. 12/250,563.
Form PCT/ISA/206 for PCT/IB2009/007116 dated Feb. 15, 2010, which corresponds to US 112/250,563.
"Cymel 303 Crosslinking Agent", Cytec Industries, Inc., West Paterson, NJ, 1995 copyright date, product bulletin obtained from http://www.cytec.com/Liquids/Downloads/CYMEL%20303%20-%20Crosslinking%20Agent_Americas_En.pdf.
"hycrocarbylene groups", IUPAC Compendium of Chemical Terminology, Second Edition (1997), obtained from http://goldbook.iupac.org/H02890.html.
Marvel et al., "Polythiolesters", J. of Am. Chem. Soc. vol. 73, No. 3, pp. 1100-pp. 1102, Year 1951.
Mizutani et al., "Design of a new bottom antireflective coating composition for KrF resist", SPIE vol. 3678 Part 1, pp. 518-pp. 526 (Mar. 1999).
"moiety", IUPAC Compendium of Chemical Terminology, Second Edition (1997), obtained from http://www.iupac.org/goldbook/M03968.pdf.
Office Action mail date Jul. 27, 2010 for U.S. Appl. No. 12/133,567.
Office Action mail date Jun. 22, 2010 for U.S. Appl. No. 12/250,563.
Form PCT/ISA/220, Form PCT/ISA/210, and Form PCT/ISA/237 for PCT/IB2009/007116 dated Apr. 29, 2010, which corresponds to U.S. Appl. No. 12/250,563.
"epoxy—Definition" mondofacto Oct. 2008, from http://www.mondofacto.com/facts/dictionary?epoxy, dated entry May 5, 2000, downloaded Jun. 18, 2010, one page.
"epoxy compounds", PAC, 1995, 67, 1307 (glossary of class names of organic compounds and reactivity intermediates based on structure (IUPAC Recommendations 1995) on p. 1334, downloaded from http://goldbook.iupac.org/e02173-plain.html16/18/10, downloaded on Jun. 18, 2010, one page.
U.S. Appl. No. 12/708,205, filed Feb. 18, 2010, Yao et al.
Office Action mail date Jan. 21, 2011 for U.S. Appl. No. 12/133,567.
Office Action mail date Sep. 23, 2010 for U.S. Appl. No. 12/250,563.
Office Action mail date Dec. 9, 2010 for U.S. Appl. No. 12/250,563.
Form PCT/IB326, Form PCT/IB/373, and Form PCT/ISA/237 for PCT/IB2009/007116 dated Apr. 28, 2011 which corresponds to U.S. Appl. No. 12/250,563.
Communication pursuant to Rules 161(1) and 162 EPC for EP 09744168.9 dated Jun. 7, 2011, which corresponds to U.S. Appl. No. 12/250,563.
Form PCT/ISA/220, Form PCT/ISA/210, and Form PCT/ISA/237 for PCT/IB2011/000370 dated May 30, 2011, which corresponds to U.S. Appl. No. 12/708,205.
Form PCT/IB/326, Form PCT/IB/373, and Form PCT/ISA/237 for PCT/IB2009/005458 dated Jan. 20, 2011 which corresponds to U.S. Appl. No. 12/133,562.
Form PCT/IB/326, Form PCT/IB/373, and Form PCT/ISA/237 for PCT/IB2009/005486 dated Jan. 20, 2011 which corresponds to U.S. Appl. No. 12/133,567.
Office Action mail date Feb. 17, 2011 for U.S. Appl. No. 12/250,563.
Complete set of specification papers for U.S. Appl. No. 13/162,065, filed Jun. 16, 2011 with cover page.
Communication pursuant to Article 94(3) EPC (EPO Form 2001) dated Jun. 20, 2011 for EP 09 785 890.6, which corresponds to U.S. Appl. No. 12/133,562.
Final Office Action mail date Jan. 5, 2012 for U.S. Appl. No. 12/133,562.
English Language Abstract of JP 1-293339 A, with publication date of Jan. 31, 1989.
Form PCT/ISA/220, Form PCT/ISA/210, and Form PCT/ISA/237 for PCT/IB2007/002340 mail date Jan. 25, 2008, which corresponds to U.S. Appl. No. 11/502,706.
Form PCT/IB/326, Form PCT/ISA/210, Form PCT/IB/373, and Form PCT/ISA/237 for PCT/IB2007/002340 mail date Jan. 25, 2008, which corresponds to U.S. Appl. No. 11/502,706.
Office Action dated Mar. 2, 2010 for EP 07789633.0, which corresponds to U.S. Appl. No. 11/502,706.
Form PCT/ISA/220, Form PCT/ISA/210, and Form PCT/ISA/237 for PCT/IB2010/002784 mail date Feb. 1, 2011, which corresponds to U.S. Appl. No. 12/609,222.
Shun-ichi Kodama et al., "Synthesis of Novel Fluoropolymer for 157nm Photoresist by Cycho-polymerization", SPIE vol. 4690, pp. 76-pp. 83 (2002).
Jerry March, Advanced Organic Chemistry: Reactions, Mechanisms, and Structure, second edition, McGraw Hill Book Company, New York, NY, 1977 (no month), pp. 41-pp. 69.
178586 Bicyclo[2.2.2]oct-7ene-2,3,5,6-tetracarboxyl dianhydride, from www.sigma-aldrich.com; catalog/search product Detail/ALDRICH/178586, printed out Oct. 24, 2007, three page.
Notice of Allowance date mailed Mar. 18, 2011 for U.S. Appl. No. 12/250,563.
Communication under Rule 71(3) EPC (EPO Form 2004) dated Mar. 16, 2012 for EP 09 785 890.6, which corresponds to U.S. Appl. No. 12/133,562.
Office Action mail date Mar. 13, 2012 for U.S. Appl. No. 12/133,567.
Form PCT/IB/326, Form PCT/IB/373, and Form PCT/ISA/237 for PCT/IB2010/002784 mail date May 10, 2012, which corresponds to U.S. Appl. No. 12/609,222.

* cited by examiner

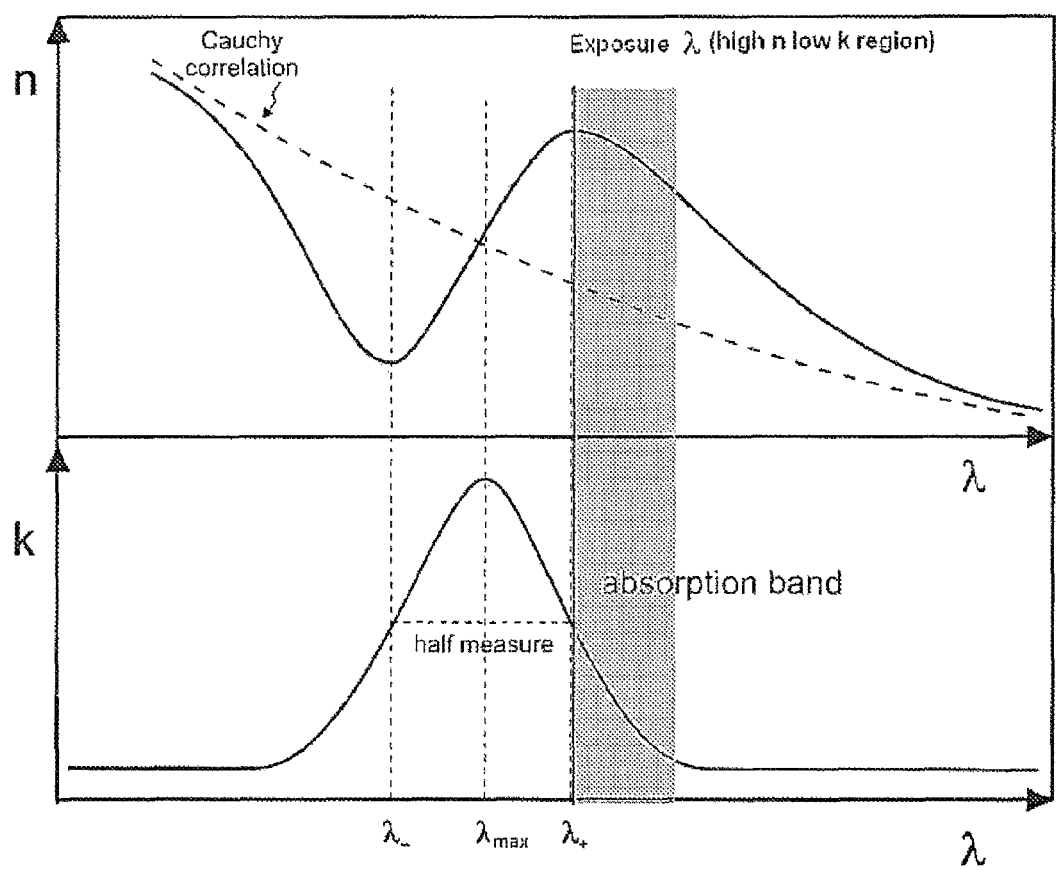

ANTIREFLECTIVE COATING COMPOSITIONS

FIELD OF INVENTION

The present invention relates to a novel antireflective coating composition and its use in image processing by forming a thin layer of the novel antireflective coating composition between a reflective substrate and a photoresist coating. Such compositions are particularly useful in the fabrication of semiconductor devices by photolithographic techniques.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

The use of highly absorbing antireflective coatings in photolithography is one approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes. Reflective notching becomes severe as the photoresist is patterned over substrates containing topographical features, which scatter light through the photoresist film, leading to line width variations, and in the extreme case, forming regions with complete photoresist loss.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The photoresist is exposed imagewise and developed. The antireflective coating in the exposed area is then etched, typically in gaseous plasma, and the photoresist pattern is thus transferred to the substrate. The etch rate of the antireflective film should be relatively high in comparison to the photoresist so that the antireflective film is etched without excessive loss of the photoresist film during the etch process. Antireflective coatings must also possess the correct absorption and refractive index at the wavelength of exposure to achieve the desired lithographic properties.

It is necessary to have a bottom antireflective coating that functions well at exposures less than 300 nm. Such antireflective coatings need to have high etch rates and be sufficiently absorbing with the correct refractive index to act as antireflective coatings.

SUMMARY OF THE INVENTION

The invention describes an antireflective coating composition which contains a novel polymer without an aromatic chromophore, which finds applications in anti-reflective coating materials in high NA lithography. The materials have ultra high etch rates because of the backbone of the polymer and the absence of aromatic chromophore attached to the polymer.

The antireflective coating composition comprising a polymer which does not contain an aromatic chromophore, an acid generator, and optionally a crosslinking agent, where the polymer comprises a structural unit derived from a diacid, a triacid, a dianhydride or its corresponding tetraacid or a mixture thereof and a structural unit derived from a diol, a dithiol, a triol, a trithiol, a diepoxy containing compound, a triepoxy containing compound, or mixture thereof, where the diol, dithiol, triol, trithiol, the diepoxy containing compound, or triepoxy containing compound contains one or more nitrogen and/or sulfur atoms or contains one or more alkylene groups.

The polymer can comprise a repetitive unit of structure (1) or (2)

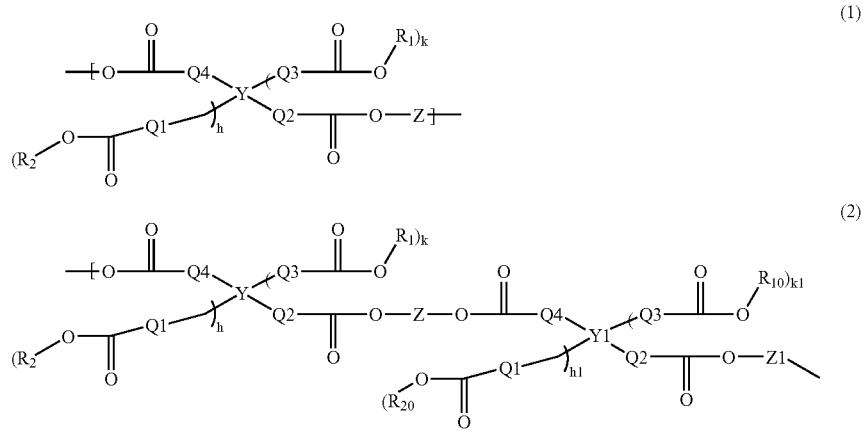

where each of Y and Y1 independently are a non-aromatic linking moiety; each of Z and Z1 independently are the structural unit derived from a diol, a dithiol, a triol, a trithiol, a diepoxy containing compound, or a triepoxy containing compound; each of $R_1$ and $R_{10}$ independently are hydrogen or the structural unit derived from a monoepoxy containing compound; each of $R_2$ and $R_{20}$ independently are $R_1$ or the structural unit derived from a dithiol, a trithiol, a diepoxy containing compound, or a triepoxy containing compound; each of Q1, Q2, Q3, and Q4 are independently a direct bond or an unsubstituted or substituted $C_{1-4}$ alkylene; each of h and h1 independently are 0 or 1; and each of k or k1 independently are 0 or 1.

The present invention is also related to a polymer which does not contain an aromatic chromophore comprising a structural unit derived from a diacid, a triacid, a dianhydride or its corresponding tetraacid or a mixture thereof and a structural unit derived from a diol, a dithiol, a triol, a trithiol, a diepoxy containing compound, a triepoxy containing compound, or mixture thereof, where the diol, dithiol, triol, trithiol, the diepoxy containing compound, or triepoxy containing compound contains one or more nitrogen and/or sulfur atoms or contains one or more alkylene groups.

The present invention also relates to a coated substrate comprising a substrate having thereon an antireflective coating layer formed from the antireflective coating composition disclosed herein, where the antireflective coating layer has an absorption parameter (k) in the range of $0.01 \leq k < 0.35$ when measured at 193 nm. In addition, the present invention also relates to a process for forming an image comprising, a) coating and baking a substrate with the antireflective coating composition disclosed herein; b) coating and baking a photoresist film on top of the antireflective coating; c) imagewise exposing the photoresist; d) developing an image in the photoresist; e) optionally, baking the substrate after the exposing step.

BRIEF DESCRIPTION OF THE DRAWINGS

FIG. 1 illustrates the principle of anomalous dispersion.

DETAILED DESCRIPTION OF THE INVENTION

The invention describes an antireflective coating composition which contains a novel polymer without an aromatic chromophore, which finds applications in anti-reflective coating materials in high NA lithography. The materials have ultra high etch rates because of the backbone of the polymer and the absence of aromatic chromophore attached to the polymer.

The antireflective coating composition comprising a polymer which does not contain an aromatic chromophore, an acid generator, and optionally a crosslinking agent, where the polymer comprises a structural unit derived from a diacid, a triacid, a dianhydride or its corresponding tetraacid or a mixture thereof and a structural unit derived from a diol, a dithiol, a triol, a trithiol, a diepoxy containing compound, a triepoxy containing compound, or mixture thereof, where the diol, dithiol, triol, trithiol, the diepoxy containing compound, or triepoxy containing compound contains one or more nitrogen and/or sulfur atoms or contains one or more alkylene groups.

The polymer can comprise a repetitive unit of structure (1) or (2)

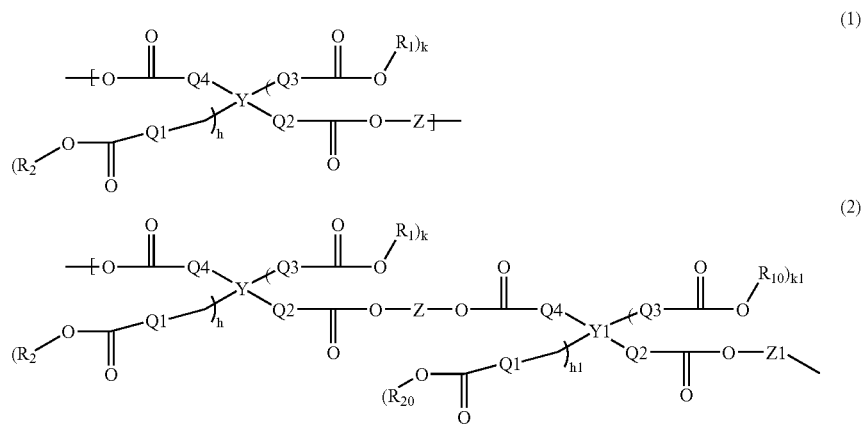

where each of Y and Y1 independently are a non-aromatic linking moiety; each of Z and Z1 independently are the structural unit derived from a diol, a dithiol, a triol, a trithiol, a diepoxy containing compound, or a triepoxy containing compound; each of $R_1$ and $R_{10}$ independently are hydrogen or the structural unit derived from a monoepoxy containing compound; each of $R_2$ and $R_{20}$ independently are $R_1$ or the structural unit derived from a dithiol, a trithiol, a diepoxy containing compound, or a triepoxy containing compound; each of Q1, Q2, Q3, and Q4 are independently a direct bond or an unsubstituted or substituted $C_{1-4}$ alkylene; each of h and h1 independently are 0 or 1; and each of k or k1 independently are 0 or 1.

The present invention is also related to a polymer which does not contain an aromatic chromophore comprising a structural unit derived from a diacid, a triacid, a dianhydride or its corresponding tetraacid or a mixture thereof and a structural unit derived from a diol, a dithiol, a triol, a trithiol, a diepoxy containing compound, a triepoxy containing compound, or mixture thereof, where the diol, dithiol, triol, trithiol, the diepoxy containing compound, or triepoxy containing compound contains one or more nitrogen and/or sulfur atoms or contains one or more alkylene groups.

The present invention also relates to a coated substrate comprising a substrate having thereon an antireflective coating layer formed from the antireflective coating composition disclosed herein, where the antireflective coating layer has an absorption parameter (k) in the range of $0.01 \leq k < 0.35$ when measured at 193 nm. In addition, the present invention also relates to a process for forming an image comprising, a) coating and baking a substrate with the antireflective coating composition disclosed herein; b) coating and baking a photoresist film on top of the antireflective coating; c) imagewise exposing the photoresist; d) developing an image in the photoresist; e) optionally, baking the substrate after the exposing step.

The polymers useful in the present invention are formed by reacting a dianhydride (e.g., 1,2,3,4-butanetetracarboxylic acid dianhydride, 1,2,3,4-pentanetetracarboxylic acid dianhydride, 1,2,4,5-cyclohexanetetracarboxylic acid dianhydride, 1,2,3,4-cyclopentanetetracarboxylic acid dianhydride, 1,2,3,4-bicyclohexenetetracarboxylic acid dianhydride, 2,3,4,5-tetrahydrofurantetracarboxylic acid dianhydride, 1,2,3,4-cyclobutanetetracarboxylic acid dianhydride, 1,2,5,6-cycloocta-1,5-dienetetracarboxylic acid dianhydride, 2,3,5-tricarboxycyclopentylacetic acid dianhydride, 3,5,6-tricarboxynorbornylacetic acid dianhydride, bicyclo[2.2.2]oct-7-ene-2,3,5,6-tetracarboxylic acid dianhydride, bicyclo[2.2.2]octane-2,3,5,6-tetracarboxylic acid dianhydride, 5-(2,5-dioxotetrahydro)-3-methyl-3-cyclohexene-1,2-dicarboxylic dianhydride, bicyclo[2.2.1]heptanetetracarboxylic 2,3:5,6-dianhydride, bicyclo[2.2.2]oct-7-enetetracarboxylic 2,3:5,6-dianhydride, and the like, etc, or its corresponding tetraacid, with a diol, dithiol, triol ortrithiol (e.g. neopentyl glycol, dialkyl tartrate, tris(2-hydroxyethyl) cyanuric acid, 1,4-dithiane-2,5-diol, 2-butene-1,4-diol, 2,3-dibromo-2-butene-1,4-diol, 1,3-propanediol, 1,6-hexanediol, 2,2-dimethyl-1,3-propanediol, diethylene glycol, triethylene glycol, and the like, etc in the presence of tetraalkylammonium chloride catalyst. As will also be appreciated, these polymers can also be made by reacting diacids or triacids with diols, dithiols, triols, trithiols, diepoxy and triepoxy compounds. Examples of diacids and triacids include 1,4-butane dicarboxylic acid, 1,8-octane dicarboxylic acid, 1,4-cyclohexane dicarboxylic acid, fumaric acid, muconic acid, and the like.

Examples of the dianhydrides, diacids, and triacids include

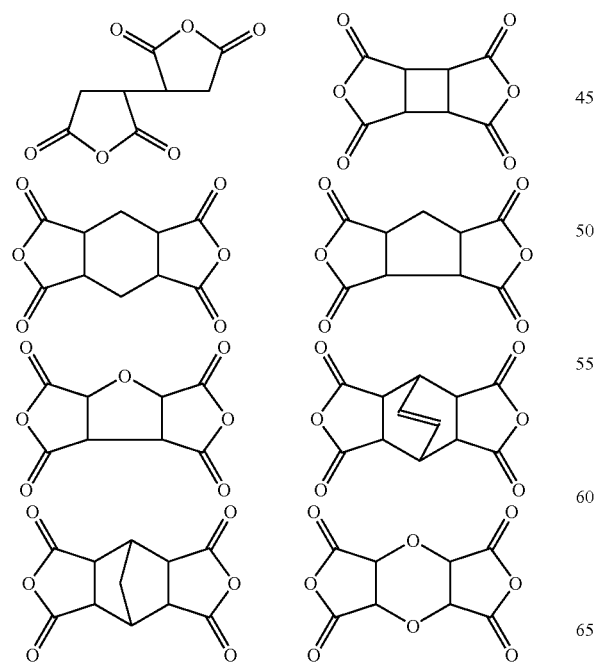

-continued

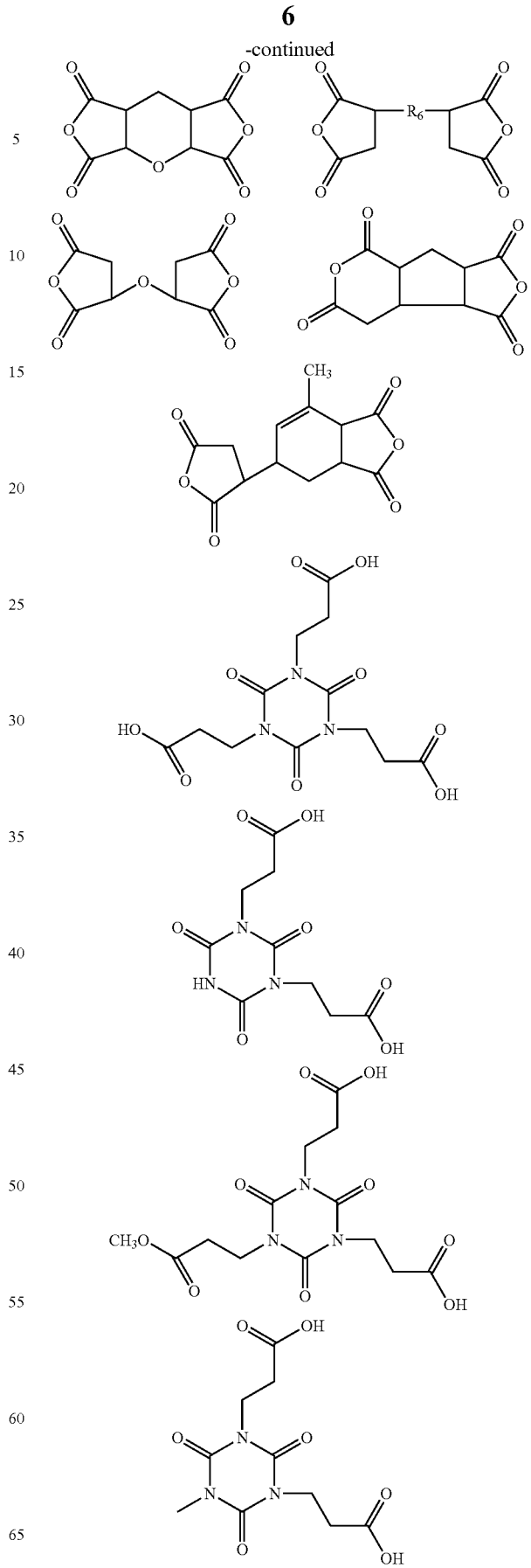

-continued
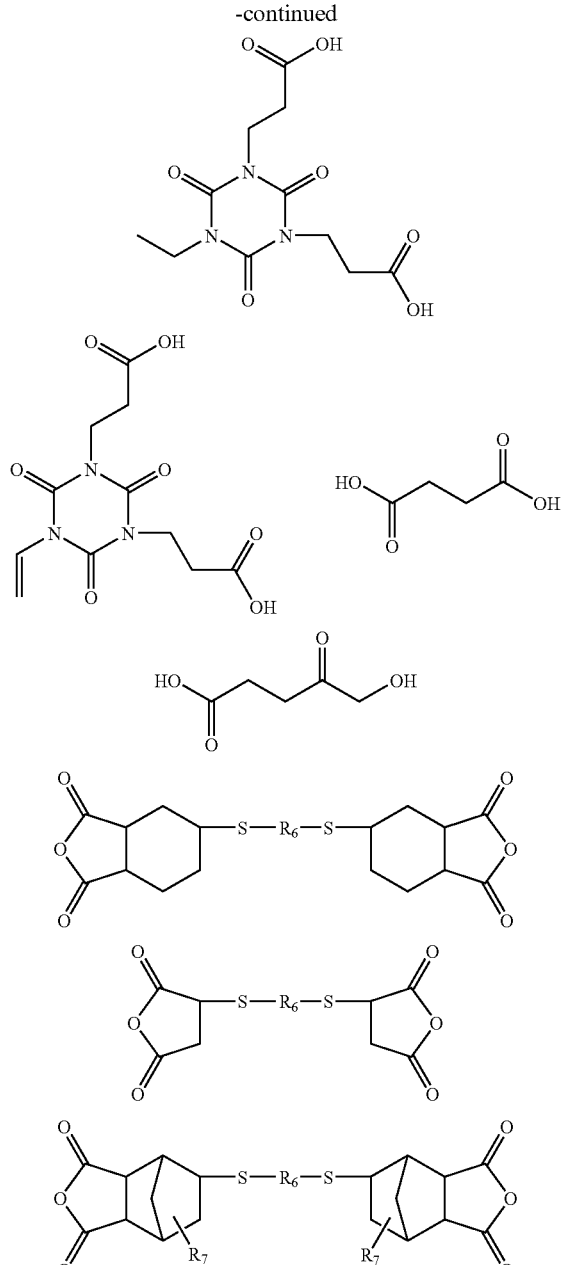
where $R_6$ is linear or branched alkylene chain of 2 to 20 carbon atoms, which may also contain an ether oxygen or ester groups, and $R_7$ is hydrogen or methyl.
Examples of $R_6$ include
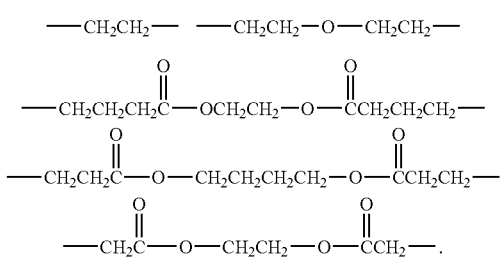
Examples of diepoxy and triepoxy compounds include
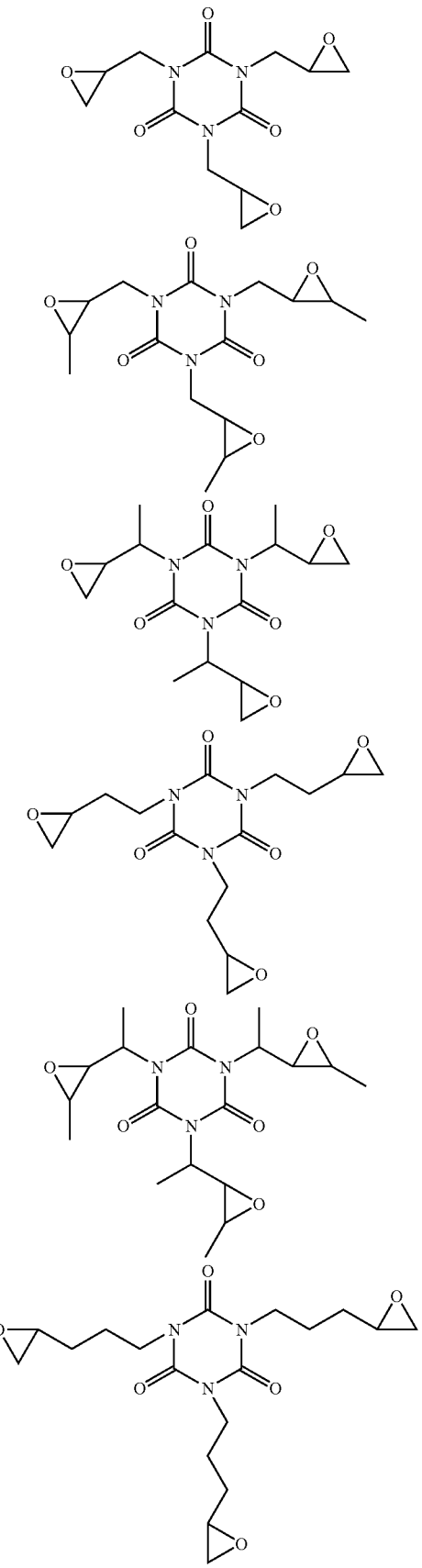

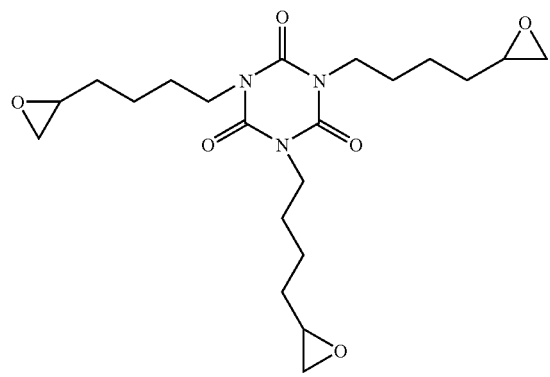
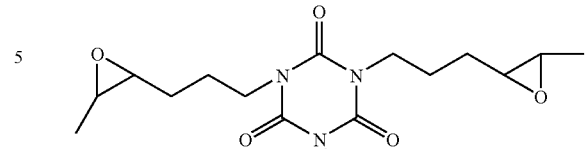
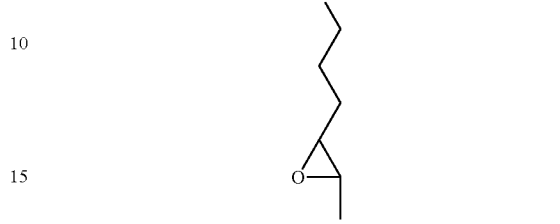
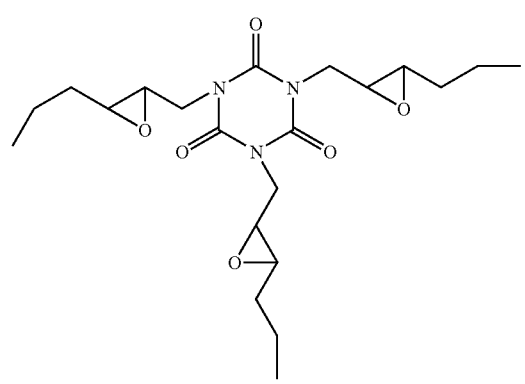
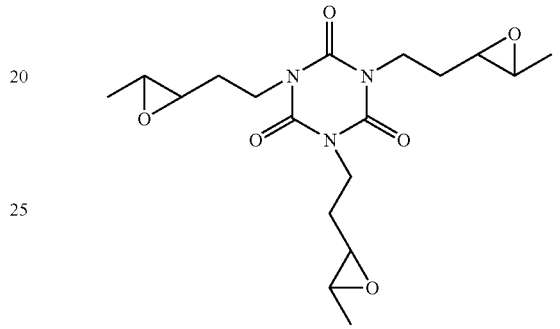
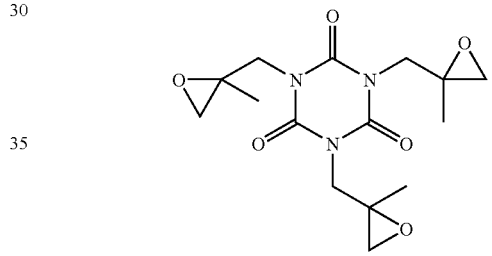
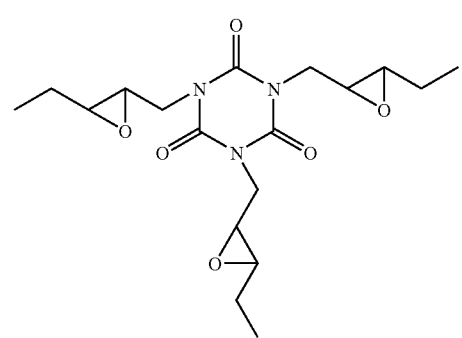
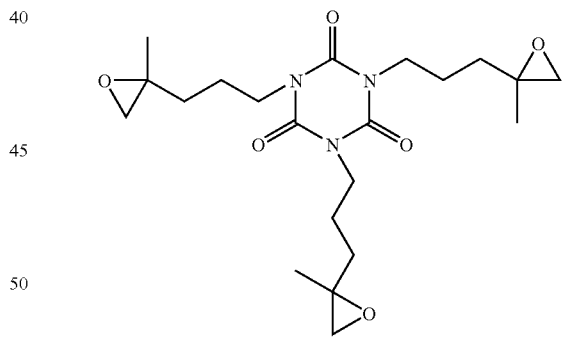
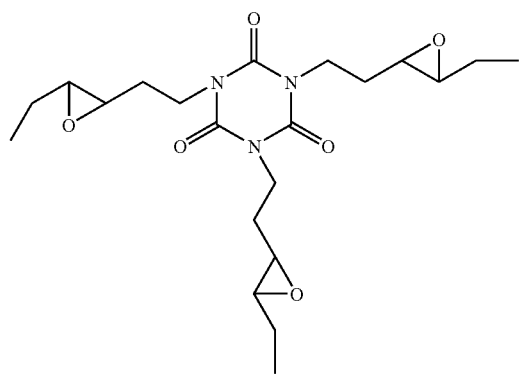
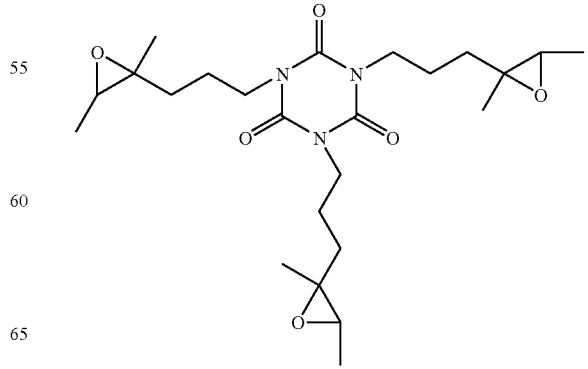

11
-continued
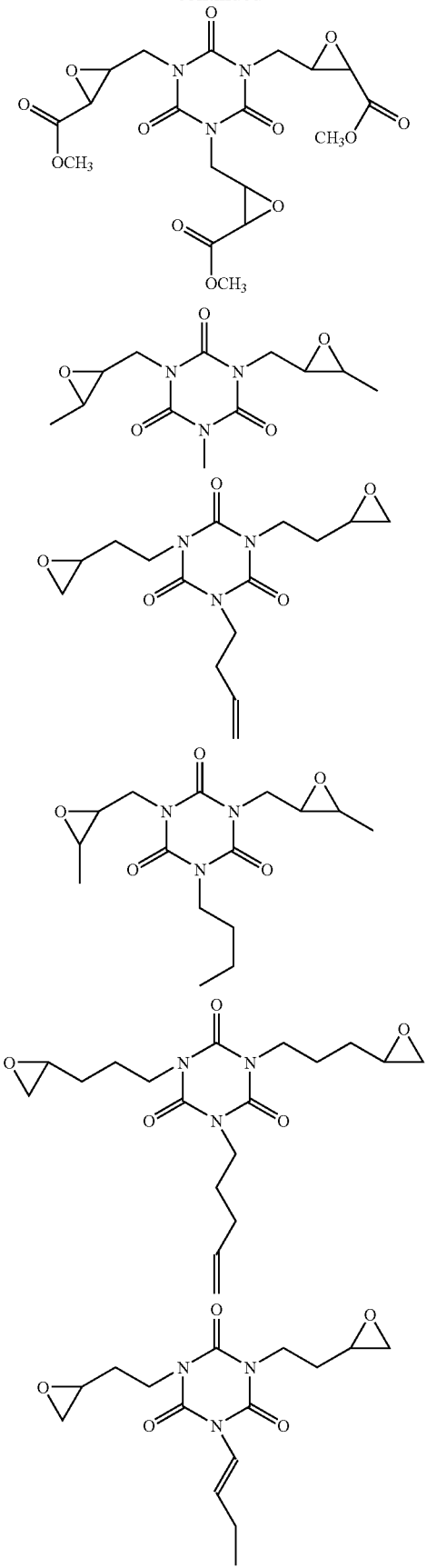
12
-continued
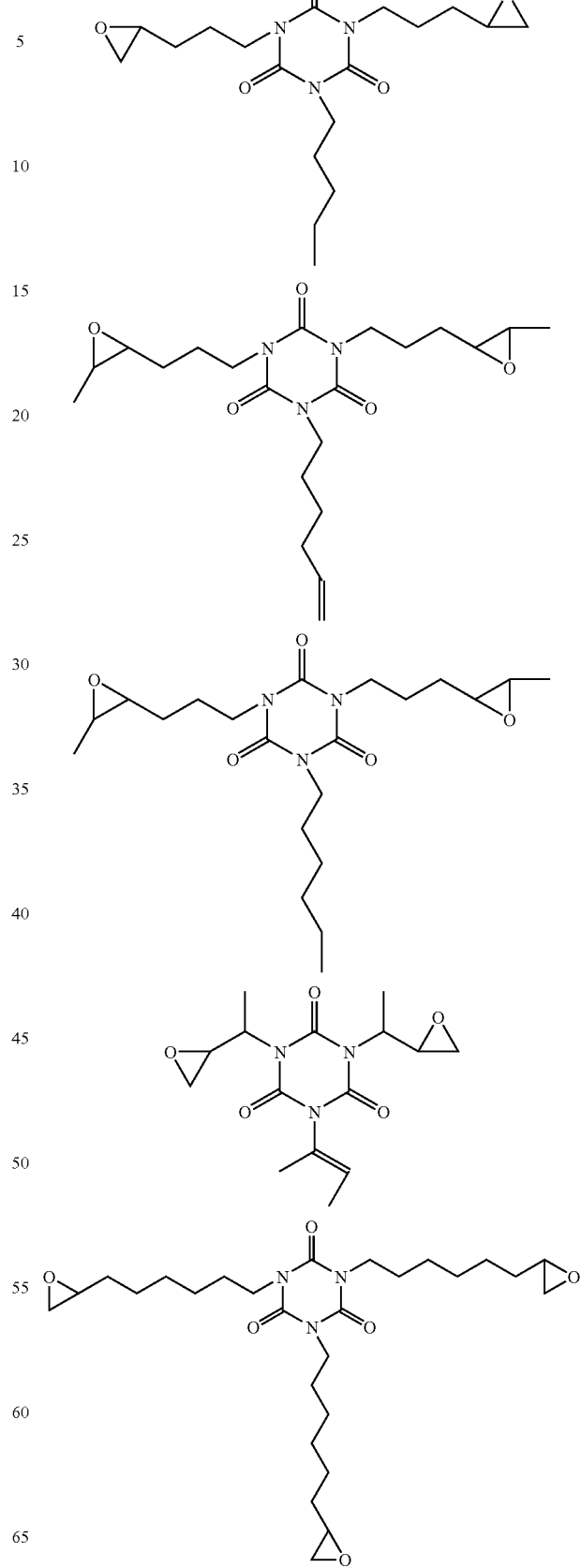

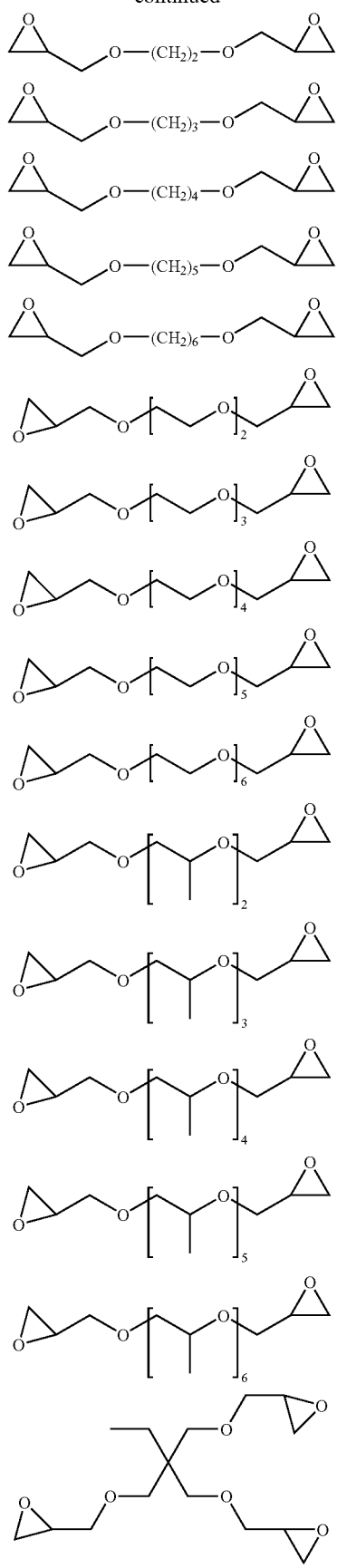
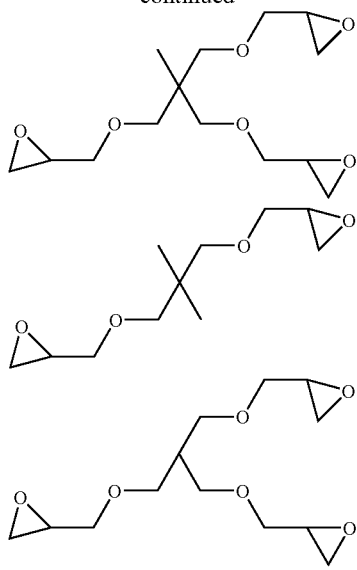
Examples of diols, dithiols, triols, and trithiols include
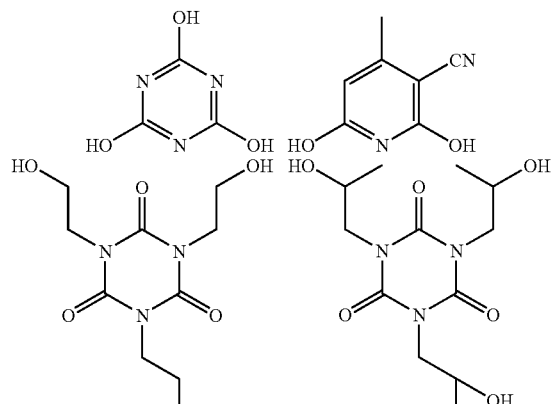
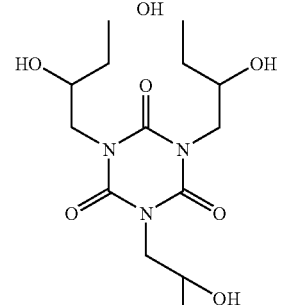
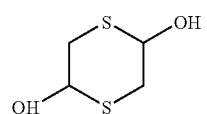
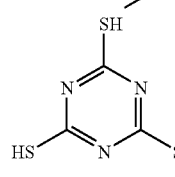
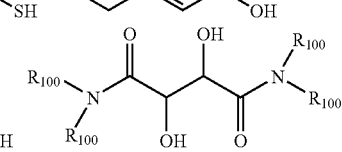

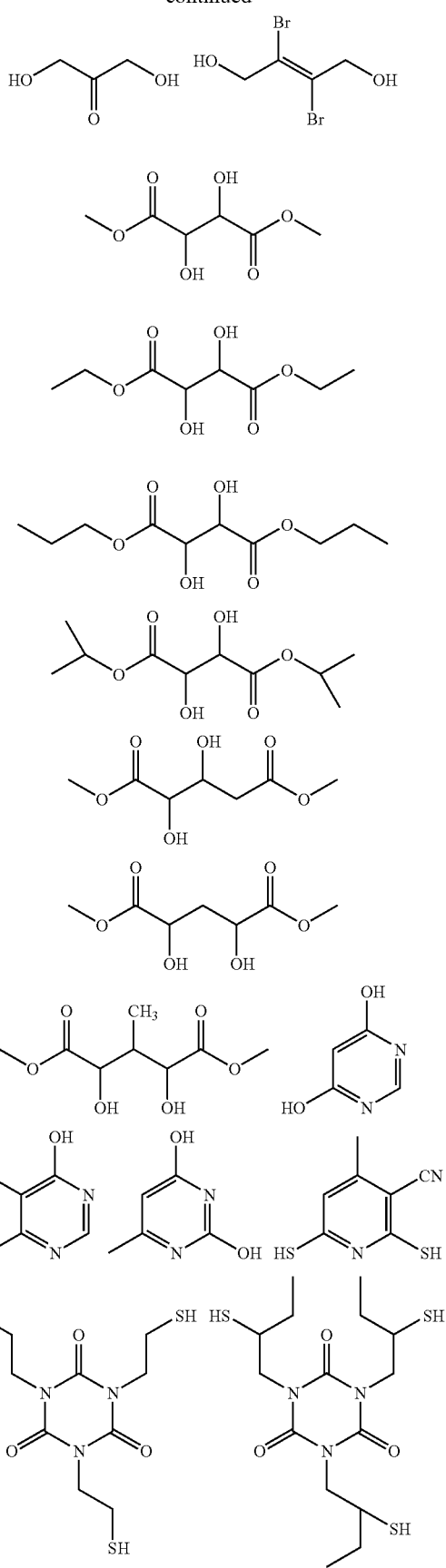
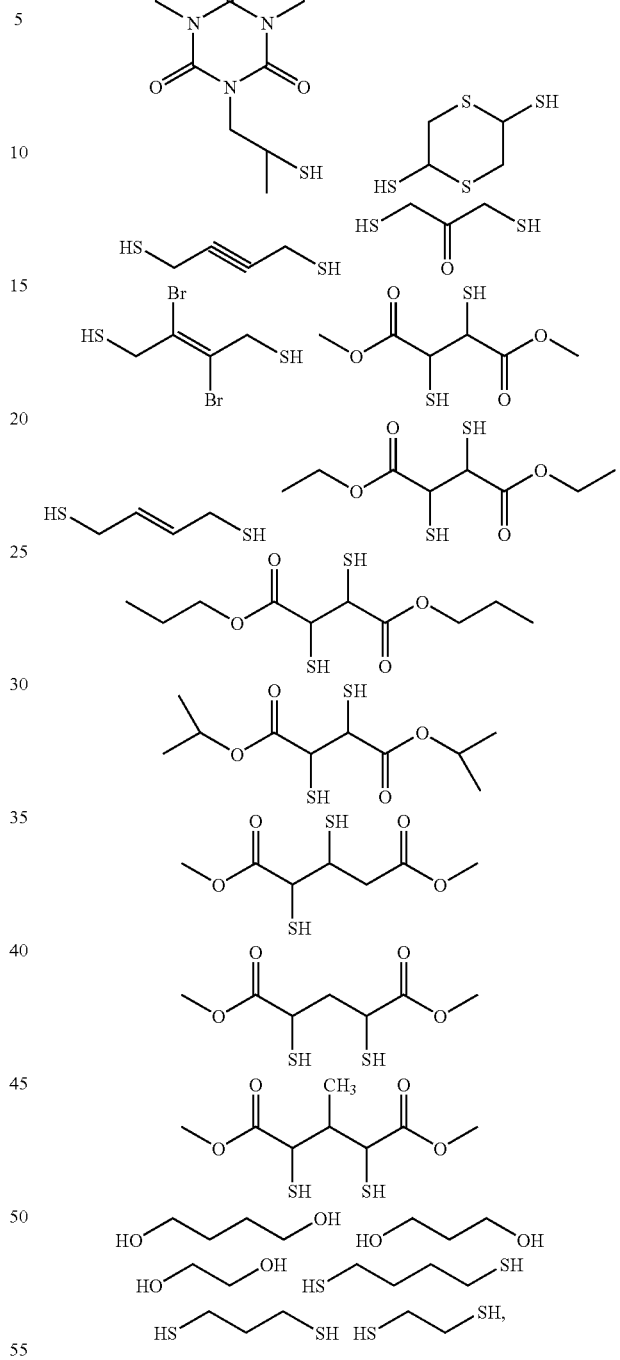

where $R_{100}$ is hydrogen, alkyl, or alkenyl.

The carboxylic acid groups in the prepolymer then undergo ring opening reactions with propylene oxide to give final product. Furthermore, a molecule with more than one epoxy functional groups (e.g. ethylene glycol diglycidyl ether, 1,4-butanediol diglycidyl ether or tris(2,3-epoxypropyl) isocyanurate) can be incorporated to obtain a self crosslinkable polyester material. Polyester can also be formed by reaction of a compound containing multiple carboxylic acid groups with a di-/tri-epoxy monomer or a diol/triol monomer.

Examples of Y and Y1 for structures (1) and (2) include
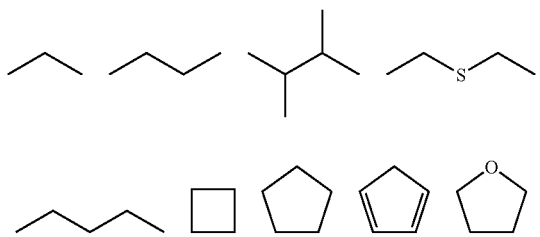
-continued
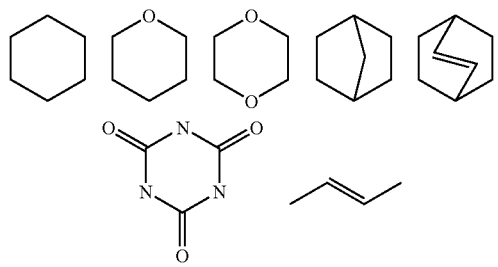
Examples of repeat units of structure (1) and (2) include
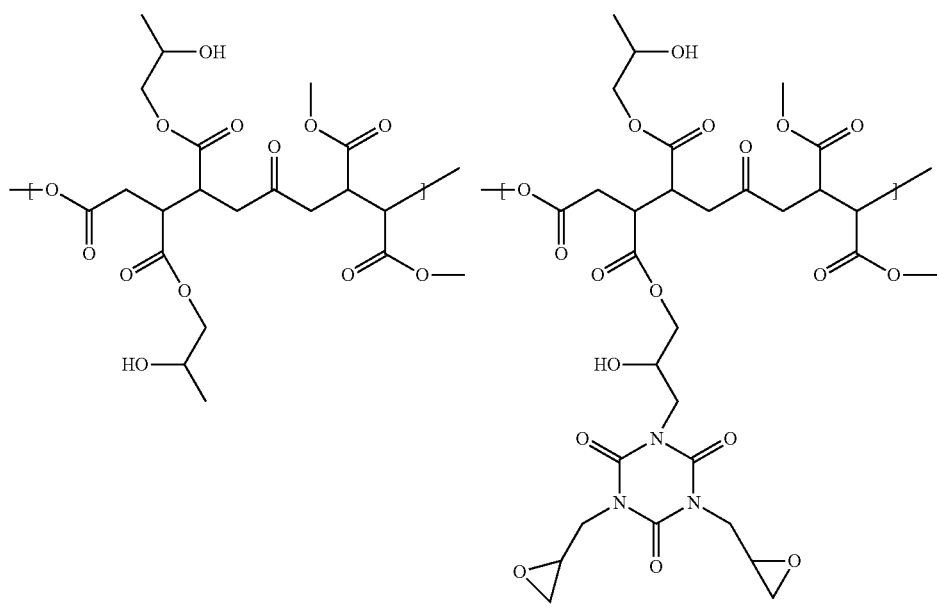
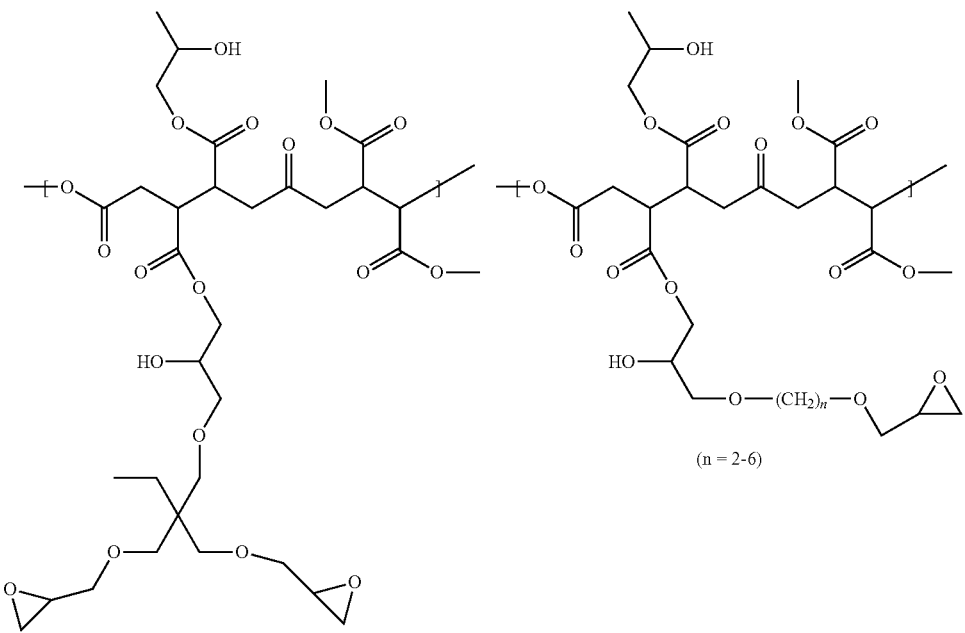
(n = 2-6)

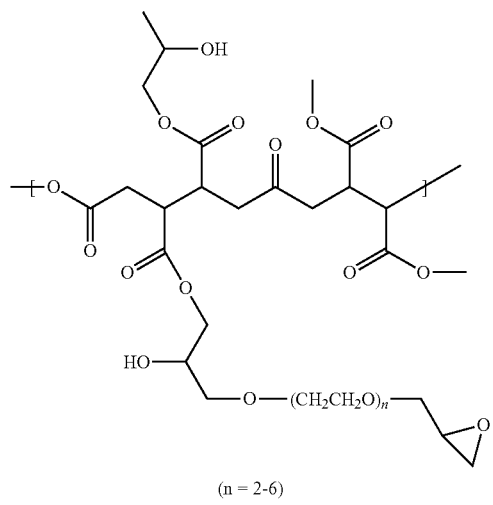
(n = 2-6)
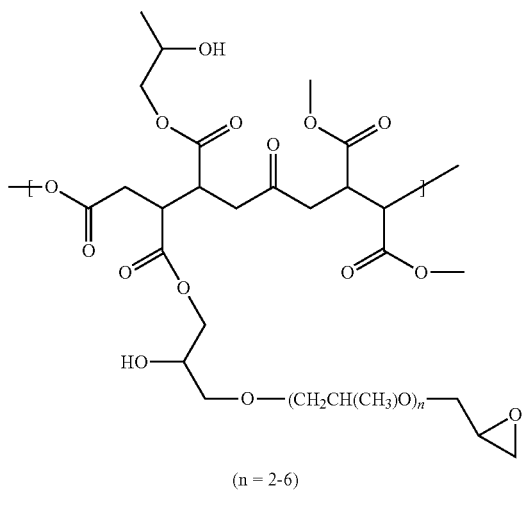
(n = 2-6)
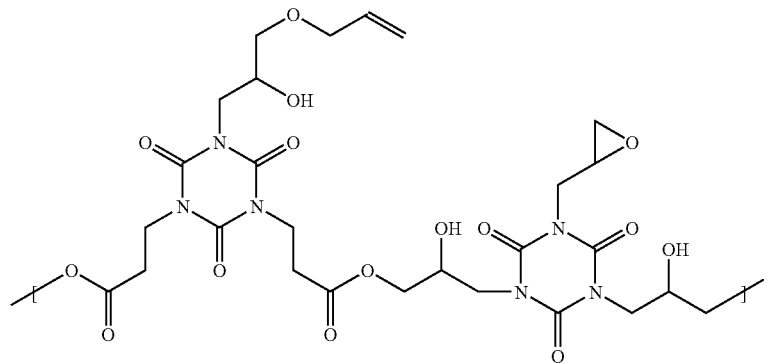
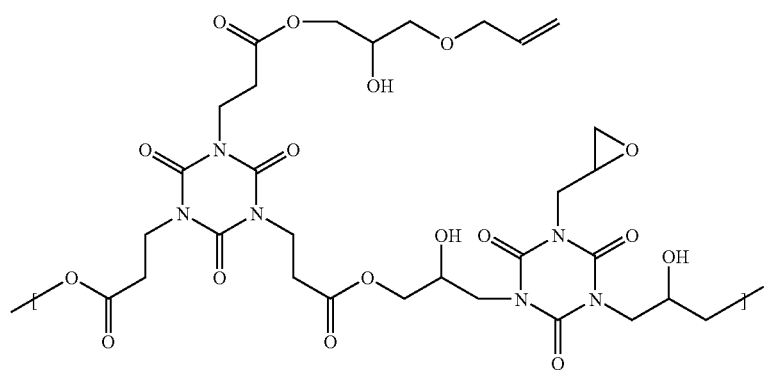

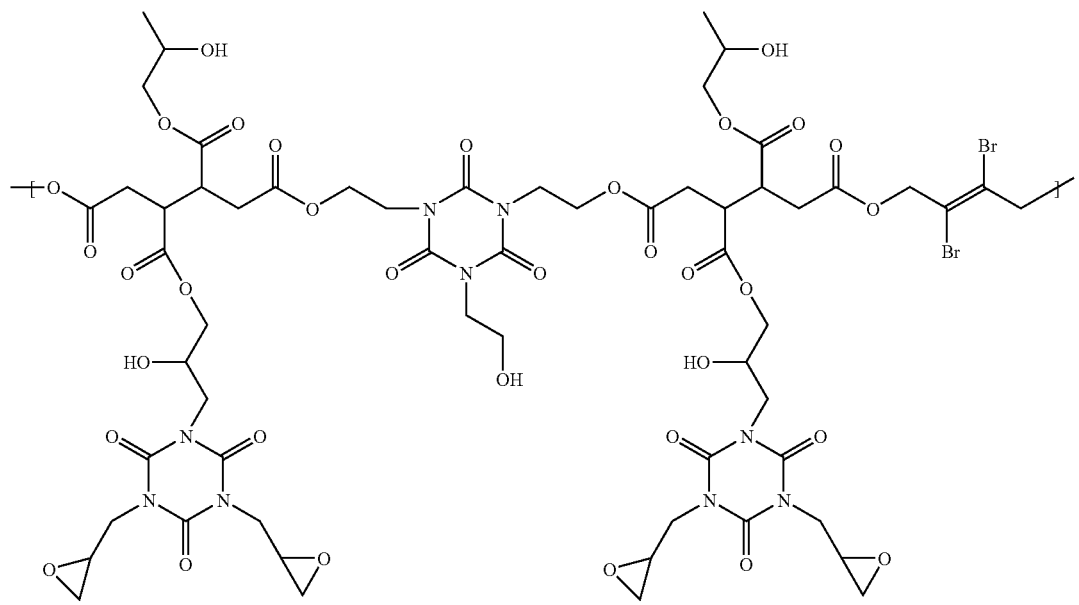

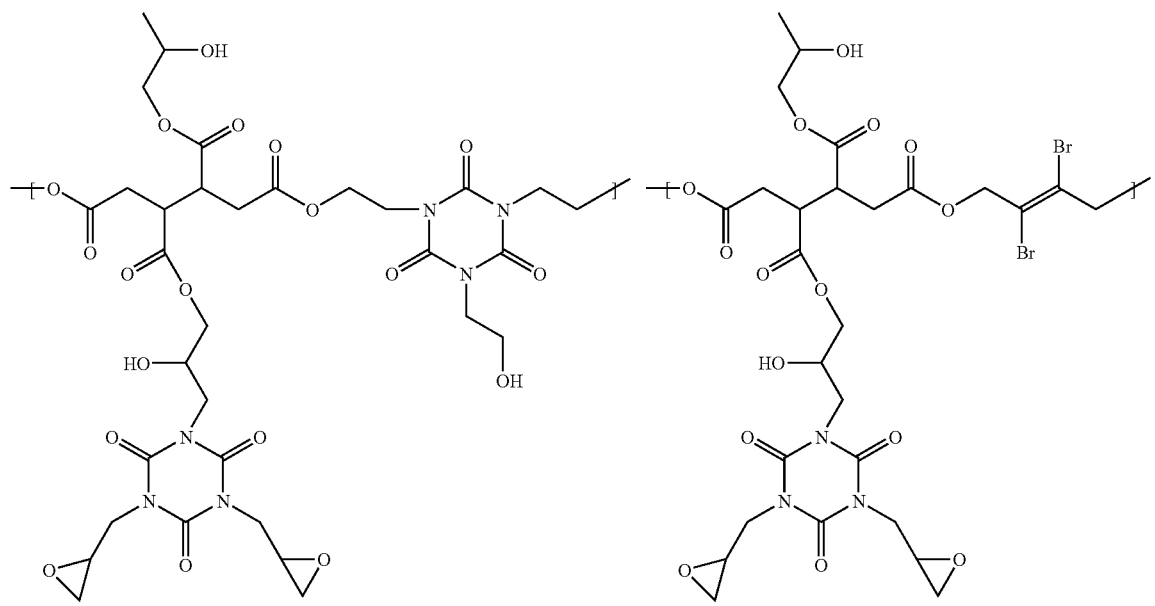

The optional crosslinking agent can be an aminoplast. The aminoplast can be substituted by two or more alkoxy groups can be based on aminoplasts such as, for example, glycoluril-aldehyde resins, melamine-aldehyde resins, benzoguan-amine-aldehyde resins, and urea-aldehyde resins. Examples of the aldehyde include formaldehyde, acetaldehyde, etc. In some instances, three or four alkoxy groups are useful. Monomeric, methylated glycoluril-formaldehyde resins are an example. One example is tetra(alkoxymethyl)glycoluril. Examples of tetra(alkoxymethyl)glycoluril, may include, e.g., tetra(methoxymethyl)glycoluril, tetra(ethoxymethyl)glycoluril, tetra(n-propoxymethyl)glycoluril, tetra(i-propoxymethyl)glycoluril, tetra(n-butoxymethyl)glycoluril and tetra(t-butoxymethyl)glycoluril. Tetra(methoxymethyl)glycoluril is available under the trademark POWDERLINK from Cytec Industries (e.g., POWDERLINK 1174). Other examples include methylpropyltetramethoxymethyl glycoluril, and methyl phenyltetramethoxymethyl glycoluril.

Other aminoplasts are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino, 1,3,5-traizine, 3,5-diaminotriazole, triaminopyrimidine, 2-mercapto-4,6-diamino-pyrimidine, 3,4,6-tris(ethylamino)-1,3,5-triazine, tris(alkoxycarbonylamino)triazine, N,N,N', N'-tetramethoxymethylurea and the like.

Other possible aminoplasts include compounds having the following structures:

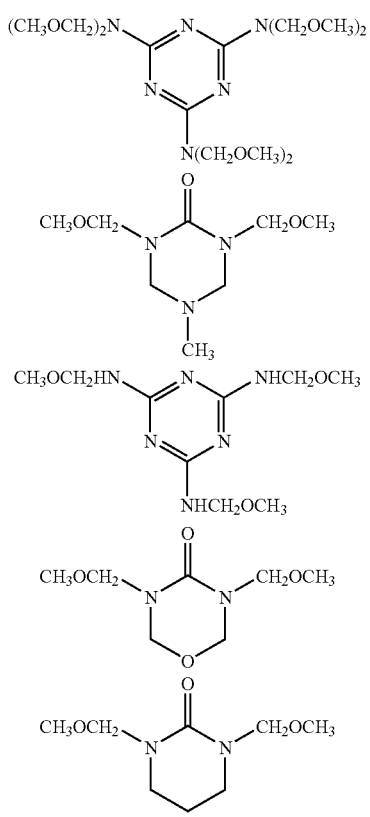

including their analogs and derivatives, such as those found in Japanese Laid-Open Patent Application (Kokai) No. 1-293339 to Tosoh, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547 to Ciba Specialty Chemicals. Various melamine and urea resins are commercially available under the Nicalacs (Sanwa Chemical Co.), Plastopal (BASF AG), or Maprenal (Clariant GmbH) tradenames.

The acid generator used with the present invention, preferably a thermal acid generator is a compound which, when heated to temperatures greater than 90° C. and less than 250° C., generates an acid. The acid, in combination with the crosslinker, crosslinks the polymer. The antireflective coating layer after heat treatment becomes insoluble in the solvents used for coating photoresists, and furthermore, is also insoluble in the alkaline developer used to image the photoresist. Preferably, the thermal acid generator is activated at 90° C. and more preferably at above 120° C., and even more preferably at above 150° C. The antireflective coating layer is heated for a sufficient length of time to crosslink the coating. Examples of acids and thermal acid generators are butane sulfonic acid, triflic acid, nanofluorobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, and the like.

Thermal acid generators are preferred over free acids, although free acids may also be used, in the novel antireflective composition, since it is possible that over time the shelf stability of the antireflective solution will be effected by the presence of the acid, if the polymer were to crosslink in solution. Thermal acid generators are only activated when the antireflective film is heated on the substrate. Additionally, mixtures of thermal acids and free acids may be used. Although thermal acid generators are preferred for crosslinking the polymer efficiently, an anti-reflective coating composition comprising the polymer and crosslinking agent may also be used, where heating crosslinks the polymer. Examples of a free acid are, without limitation, strong acids, such as sulfonic acids. Sulfonic acids such as toluene sulfonic acid, triflic acid or mixtures of these are preferred.

The novel composition may further contain a photoacid generator, examples of which without limitation, are onium salts, sulfonate compounds, nitrobenzyl esters, triazines, etc. The preferred photoacid generators are onium salts and sulfonate esters of hydroxyimides, specifically diphenyl iodinium salts, triphenyl sulfonium salts, dialkyl iodonium salts, triakylsulfonium salts, and mixtures thereof. One or more cross-linking catalysts can be used in the composition.

Examples of solvents for the coating composition include alcohols, esters, glymes, ethers, glycol ethers, glycol ether esters, ketones, lactones, cyclic ketones, and mixtures thereof. Examples of such solvents include, but are not limited to, propylene glycol methyl ether, propylene glycol methyl ether acetate, cyclohexanone, 2-heptanone, ethyl 3-ethoxy-propionate, propylene glycol methyl ether acetate, ethyl lactate, gamma valerolactone, methyl 3-methoxypropionate, and mixtures thereof. The solvent is typically present in an amount of from about 40 to about 99 weight percent. In certain instances, the addition of lactone solvents is useful in helping flow characteristics of the antireflective coating composition when used in layered systems. When present, the lactone solvent comprises about 1 to about 10% of the solvent system. γ-valerolactone is a useful lactone solvent.

The amount of the polymer in the present composition can vary from about 100 weight % to about 1 weight % relative to the solid portion of the composition. The amount of the crosslinker in the present composition, when used, can vary from 0 weight % to about 50 weight % relative to the solid portion of the composition. The amount of the acid generator in the present composition can vary from 0.1 weight % to about 10 weight % relative to the solid portion of the composition.

The present composition can optionally comprise additional materials typically found in antireflective coating compositions such as, for example, monomeric dyes, lower alcohols, surface leveling agents, adhesion promoters, antifoaming agents, etc, provided that the performance is not negatively impacted.

Since the composition is coated on top of the substrate and is further subjected to dry etching, it is envisioned that the composition is of sufficiently low metal ion level and purity that the properties of the semiconductor device are not adversely affected. Treatments such as passing a solution of the polymer, or compositions containing such polymers, through an ion exchange column, filtration, and extraction processes can be used to reduce the concentration of metal ions and to reduce particles.

The optical characteristics of the antireflective coating are optimized for the exposure wavelength and other desired lithographic characteristics. As an example the absorption parameter (k) of the novel composition for 193 nm exposure ranges from about 0.01 to about 1.0, preferably from about 0.1 to about 0.35 as measured using ellipsometry. The value of the refractive index (n) ranges from about 1.25 to about 2.0, preferably from about 1.7 to about 2.0. Due to the good absorption characteristics of this composition at 193 nm, very thin antireflective films of the order of about 40 nm may be used. This is particularly advantageous when using a nonaromatic photoresist, such as those sensitive at 193 nm, 157 nm and lower wavelengths, where the photoresist films are thin and must act as an etch mask for the antireflective film.

The substrates over which the antireflective coatings are formed can be any of those typically used in the semiconductor industry. Suitable substrates include, without limitation, silicon, silicon substrate coated with a metal surface, copper coated silicon wafer, copper, substrate coated with antireflective coating, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

The coating composition can be coated on the substrate using techniques well known to those skilled in the art, such as dipping, spincoating or spraying. The film thickness of the anti-reflective coating ranges from about 0.01 µm to about 1 µm. The coating can be heated on a hot plate or convection oven or other well known heating methods to remove any residual solvent and induce crosslinking if desired, and insolubilizing the anti-reflective coatings to prevent intermixing between the anti-reflective coating and the photoresist. The preferred range of temperature is from about 90° C. to about 250° C. If the temperature is below 90° C. then insufficient loss of solvent or insufficient amount of crosslinking takes place, and at temperatures above 300° C. the composition may become chemically unstable. A film of photoresist is then coated on top of the uppermost antireflective coating and baked to substantially remove the photoresist solvent. An edge bead remover may be applied after the coating steps to clean the edges of the substrate using processes well known in the art.

There are two types of photoresist compositions, negative-working and positive-working. When negative-working photoresist compositions are exposed image-wise to radiation, the areas of the resist composition exposed to the radiation become less soluble to a developer solution (e.g. a crosslinking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

Along with the positive and negative photoresists mentioned above, which are typically done dry, 193 nm immersion lithography is a viable solution for nodes down to 45 nm node and beyond. With absorptive underlayers at 193 nm, low "k" BARCs are more suitable for optimum substrate reflectivity control based on simulations. On the other hand, the BARC film needs to be thin enough to have desired etch selectivity for very small features in thin film lithography. The low film thickness requires high n value for BARCs. This invention describes an antireflective coating composition which contains a novel polymer with non-aromatic dyes. The dye is less absorbing at 193 nm than that of conventional 193 nm BARC, e.g. phenyl or its derivatives. The invention takes advantage of anomalous dispersion effects near the absorption maxima $\lambda_{max}$ (excluding $\lambda_{max}$) by a judicious choice of the dye. The dye with absorbance maxima lower than the exposure absorbance (193 nm) is used to achieve hyper n value. Theoretically, a n value that is above the value predicted from the Cauchy correlation is considered high, which covers entire half of the absorbance band in high wavelength area. When a moderately strong dye is used, the high n low k material should ideally have absorption maxima, $\lambda_{max}$, such that the actinic wavelength is the same as the wavelength $\lambda_+$ that is at half height of the absorption band on the higher wavelength side of the absorption band (FIG. 1). The absorption maxima $\lambda_{max}$ moving from that position in the shorter wavelength direction up to a half length ($\lambda_{max}-\lambda_-$) forces exposure wavelength $\lambda$ to fall into a typical high n low k region indicated in FIG. 1. The amplitude of the refractive index fluctuation is not only determined by the position of $\lambda_{max}$ but also influenced by the strength of absorbance based on a Kramers-Kronic relation. In principle, nearly any increment of n value can be achieved as long as the dye has extremely strong absorbance corresponding to the anomalous dispersion area. The low k requirement of the organic BARC limits the amplitude of n enhancement and adds challenges in dye selection and material development. We have successfully incorporated dyes with absorption maxima between 160-190 nm, preferably between 170-190 nm such as cyanuric acid into the polymer structure.

It should be mentioned that optical indices used in the antireflective coating is not the same as the absorption property of organic compound in its pure form or in its liquid solution. The absorption spectrum of a dye in coating may shift due to changes of chemical and physical environment such as solvent, additives and possible chemical reactions. A dye behaves ideally in solution may not be right for antireflective coating. The invention has studied many low k BARC materials with various carefully selected dyes and the structures are presented in this work.

A process of the instant invention comprises coating a substrate with a coating composition comprising a polymer of the present invention and heating the substrate on a hotplate or convection oven or other well known heating methods at a sufficient temperature for sufficient length of time to remove the coating solvent, and crosslink the polymer if necessary, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask. Various gases are known in the art for etching organic anti-reflective coatings, such as $O_2$, $Cl_2$, $F_2$ and $CF_4$. This process is generally known as a bilayer process.

An intermediate layer may be placed between the antireflective coating and the photoresist to prevent intermixing, and is envisioned as lying within the scope of this invention. The intermediate layer is an inert polymer cast from a solvent, where examples of the polymer are polysulfones and polyimides.

In addition, a multilayer system, for example, a trilayer system, or process is also envisioned within the scope of the invention. In a trilayer process for example, an organic film is formed on a substrate, an antireflection film is formed on the organic film, and a photoresist film is formed on the antireflection film. The organic film can also act as an antireflection film. The organic film is formed on a substrate as a lower resist film by spin coating method etc. The organic film may or may not then crosslinked with heat or acid after application by spin coating method etc. On the organic film is formed the antireflection film, for example that which is disclosed herein, as an intermediate resist film. After applying the antireflection film composition to the organic film by spin-coating etc., an organic solvent is evaporated, and baking is carried out in order to promote crosslinking reaction to prevent the antireflection film from intermixing with an overlying photoresist film. After the antireflection film is formed, the photoresist film is formed thereon as an upper resist film. Spin coating method can be used for forming the photoresist film as with forming the antireflection film. After photoresist film composition is applied by spin-coating method etc., pre-baking is carried out. After that, a pattern circuit area is exposed, and post exposure baking (PEB) and development with a developer are carried out to obtain a resist pattern.

Another trilayer resist process is such when a bottom layer is formed with a carbon etch mask. On top of the bottom layer, an intermediate layer is formed by using an intermediate resist layer composition containing silicon atoms. On top of the intermediate layer, an antireflection layer based on the antireflection coating composition of the present invention, is formed. Finally, on top of the antireflection layer, a top layer is formed by using a top resist layer composition of a photoresist composition. In this case, examples of the composition for forming the intermediate layer may include polysilsesquioxane-based silicone polymer, tetraorthosilicate glass (TEOS), and the like. Then films prepared by spin-coating such a composition, or a film of $SiO_2$, SiN, or SiON prepared by CVD may be used as the intermediate layer. The top resist layer composition of a photoresist composition preferably comprises a polymer without a silicon atom. A top resist layer comprising a polymer without a silicon atom has an advantage of providing superior resolution to a top resist layer comprising a polymer containing silicon atoms. Then in the same fashion as the bilayer resist process mentioned above, a pattern circuit area of the top resist layer is exposed according to standard procedures. Subsequently, post exposure baking (PEB) and development are carried out to obtain a resist pattern, followed by etching and further lithographic processes.

The following examples provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthesis Example 1

10 g of butanetetracarboxylic acid dianhydride, 10 g of (+)-dimethyl L-tartrate, 1.0 g of benzyltributylammonium chloride, and 35 g of propylene glycol monomethyl ether acetate (PGMEA) were charged into a flask with a condenser, thermal controller and a mechanical stirrer. Under nitrogen and stirring, the mixture was heated to 110° C. A clear solution was obtained after ~1-2 hr. The temperature was kept at 110° C. for 4 hrs. After cooling to 40° C., 10 g of PGMEA and 34 g of propylene oxide were mixed with the above solution. The reaction was kept at 50° C. for 48 hrs. The reaction solution was cooled to room temperature and slowly poured into large amount of water in a high speed blender. The polymer was collected and washed thoroughly with water. Finally the polymer was dried in a vacuum oven.

Synthesis Example 2

20 g of butanetetracarboxylic acid dianhydride, 20 g of (+)-dimethyl L-tartrate, 1.0 g of benzyltributylammonium chloride, and 70 g of propylene glycol monomethyl ether acetate (PGMEA) were charged into a flask with a condenser, thermal controller and a mechanical stirrer. Under nitrogen and stirring, the mixture was heated to 110° C. A clear solution was obtained after ~1-2 hr. The temperature was kept at 110° C. for 4 hrs. After cooling to 60° C., 40 g of PGMEA, 60 g of acetonitrile, 68 g of propylene oxide and 30 g of tris(2, 3-epoxypropyl) isocyanurate were mixed with the above solution. The reaction was kept at 52° C. for 40 hrs. The reaction solution was cooled to room temperature and slowly poured into large amount of water in a high speed blender. The polymer was collected and washed thoroughly with water. Finally the polymer was dried in a vacuum oven. 40 g of polymer was obtained with a weight average molecular weight (MW) of about 32000 g/mol.

Synthesis Example 3

20 g of butanetetracarboxylic acid dianhydride, 13.5 g of 2,3-dibromo-2-butene-1,4-diol, 1.0 g of benzyltributylammonium chloride, and 110 g of propylene glycol monomethyl ether acetate (PGMEA) were charged into a flask with a condenser, thermal controller and a mechanical stirrer. Under nitrogen and stirring, the mixture was heated to 110° C. A clear solution was obtained after ~2-3 hr. 9.2 g of tris(2-hydroxyethyl) cyanuric acid was then added. The temperature was kept at 110° C. for 3 hrs (a total of 6 h). After cooling to 60° C., 60 g of acetonitrile, 68 g of propylene oxide and 30 g of tris(2,3-epoxypropyl) isocyanurate were mixed with the above solution. The reaction was kept at 52° C. for 40 hrs. The reaction solution was cooled to room temperature and slowly poured into large amount of water in a high speed blender.

The polymer was collected and washed thoroughly with water, and then dried in a vacuum oven.

Synthesis Example 4

10 grams of isocyanuric acid bis(2-carboxyethyl) ester, 7.4 grams of allyl glycidyl ether 0.3 g of benzyltributylammonium chloride and 100 grams of cyclohexanone were charged into a 250 mL flask with a thermometer, a cold water condenser and a mechanical stirrer. The reaction mixture was heated to 115° C. under nitrogen. The reaction was maintained at this temperature for 6 hours. After cooling down to 105° C., 6.0 g of tris(2,3-epoxypropyl) isocyanurate was added and reaction continued at 105° C. for another 24 hours. The reaction solution was then cooled to room temperature and a ~20 solid % polymer solution was obtained.

Synthesis Example 5

15 grams of 1,3,5-tris(2-carboxyethyl) isocyanurate, 8.4 grams of allyl glycidyl ether 0.5 g of benzyltributylammonium chloride and 125 grams of cyclohexanone were charged into a 500 mL flask with a thermometer, a cold water condenser and a mechanical stirrer. The reaction mixture was heated to 105° C. under nitrogen. The reaction was maintained at this temperature for 24 hours. 6.5 g of tris(2,3-epoxypropyl) isocyanurate was added and reaction continued for another 24 hours. The reaction solution was then cooled to room temperature and a ~20 solid % polymer solution was obtained. The average MW is about 10000.

Synthesis Example A 600 grams of tetramethoxymethyl glycoluril, 96 grams of styrene glycol and 1200 grams of PGMEA were charged into a 2 L jacketed flask with a thermometer, mechanical stirrer and a cold water condenser and heated to 85° C. After a catalytic amount of para-toluenesulfonic acid monohydrate was added, the reaction was maintained at this temperature for 5 hrs. The reaction solution was then cooled to room temperature and filtered. The filtrate was slowly poured into distilled water while stirring to precipitate the polymer. The polymer was filtered, washed thoroughly with water and dried in a vacuum oven (250 grams were obtained). The polymer obtained had a weight average molecular weight of about 17,345 g/mol and a polydispersity of 2.7.

Synthesis Example B 10 g of butanetetracarboxylic acid dianhydride, 7 g of styrene glycol, 0.5 g of benzyltributylammonium chloride, and 35 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after ~1-2 hr. The temperature was kept at 110° C. for 3 hrs. Upon cooling, 30 g of PGMEA, 30 g of acetonitrile, 36 g of propylene oxide and 21 g of tris(2,3-epoxypropyl) isocyanurate were mixed with the above solution. The reaction was kept at 55° C. for 24 hrs. The reaction solution was cooled to room temperature and slowly poured into a large amount of water in a high speed blender. The polymer was collected and washed thoroughly with water. Finally the polymer was dried in a vacuum oven. 22 g of polymer was obtained with a weight average molecular weight (MW) of about 15,000 g/mol.

Coating Formulation Example 1

1.0 g of polymer from Synthesis Example 1 and 0.2 g of tetramethoxymethyl glycoluril were dissolved in 30 g of PGMEA/PGME 70/30 solvent to make a 3.3 wt % solution. 0.1 g of 10% solution of dodecylbenzene sulfonic acid/triethylamine in of PGMEA/PGME 70/30 solvent was added in the polymer solution. The mixture was filtered through a micro filter with a pore size of 0.2 µm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 2

1.0 g of polymer from Synthesis Example 2 was dissolved in 30 g of PGMEA/PGME 70/30 solvent to make a 3.3 wt % solution. 0.1 g of 10% nanofluorobutanesulfonic acid/triethylamine in of PGMEA/PGME 70/30 solvent was added in the polymer solution. The mixture was filtered through a micro filter with a pore size of 0.2 µm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 3

1.0 g of polymer from Synthesis Example 3 was dissolved in 30 g of PGMEA/PGME 70/30 solvent to make a 3.3 wt % solution. 0.1 g of 10% nanofluorobutanesulfonic acid/triethylamine in of PGMEA/PGME 70/30 solvent was added in the polymer solution. The mixture was filtered through a micro filter with a pore size of 0.2 µm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 4

0.25 g of the polymer solid from Synthesis Example 1 and 0.75 g of the polymer from Synthesis Example A was dissolved in 30 g of PGMEA/PGME 70/30 solvent to make a 3.3 wt % solution. 0.1 g of 10% solution of dodecylbenzene sulfonic acid/triethylamine in of PGMEA/PGME 70/30 solvent was added in the polymer solution. The mixture then was filtered through a micro filter with a pore size of 0.2 µm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 5

0.25 g of the polymer solid from Synthesis Example 2 and 0.75 g of the polymer from Synthesis Example A was dissolved in 30 g of PGMEA/PGME 70/30 solvent to make a 3.3 wt % solution. 0.1 g of 10% solution of dodecylbenzene sulfonic acid/triethylamine in of PGMEA/PGME 70/30 solvent was added in the polymer solution. The mixture then was filtered through a micro filter with a pore size of 0.2 µm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 6

1.0 g of polymer solution from Synthesis Example 4 was dissolved in 6 g of PGMEA/PGME 70/30 solvent to make a 3 wt % solution. 1% nanofluorobutanesulfonic acid/triethylamine was added in the polymer solution. The mixture then was filtered through a micro filter with a pore size of 0.2 μm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Coating Formulation Example 7

1.0 g of polymer solution from Synthesis Example 5 was dissolved in 6 g of PGMEA/PGME 70/30 solvent to make a 3 wt % solution. 1% nanofluorobutanesulfonic acid/triethylamine was added in the polymer solution. The mixture then was filtered through a micro filter with a pore size of 0.2 μm and coated on a silicon wafer and baked at 200° C. for 90 seconds. The wafer was submitted for evaluation of optical parameters using a spectroscopic Ellipsometer. The optimized refractive index "n" at 193 nm and the absorption parameter "k" are listed in Table 1.

Optical Parameter Evaluation from Coating Formulation Examples

TABLE 1

| Coating Formulation Example | n & k measurements at 193 nm. | |
|---|---|---|
| | n | k |
| 1 | 1.66 | 0.01 |
| 2 | 1.73 | 0.08 |
| 3 | 1.78 | 0.13 |
| 4 | 1.83 | 0.24 |
| 5 | 1.83 | 0.26 |
| 6 | 1.91 | 0.30 |
| 7 | 1.92 | 0.25 |

Litho Formulation Example 1

0.5 g of polymer from Synthesis Example 2 and 0.5 g of polymer from Synthesis Example A were dissolved in 20 g of PGMEA/PGME (70/30) solvent and 0.4 g of γ-valerolactone to make a ~5 wt % solution. 1% of dodecylbenzene sulfonic acid/triethylamine, and 1% of triphenylsulfonium nonaflate were added in the polymer solution. The mixture then was filtered through a micro filter with a pore size of 0.2 μm.

Litho Formulation Example 2

0.5 g of polymer from Synthesis Example 2 and 0.5 g of polymer from Synthesis Example B were dissolved in 20 g of PGMEA/PGME (70/30) solvent to make a ~5 wt % solution. 1% of nanofluorobatane sulfonic acid/triethylamine was added in the polymer solution. The mixture then was filtered through a micro filter with a pore size of 0.2 μm.

Litho Performance Evaluation of Litho Formulation Example 1

The performance of the anti-reflective coating formulation from Litho Formulation Example 1 was evaluated using T83472 photoresist (product of AZ Electronic Materials USA Corp., Somerville, N.J.). About 140 nm thick film of Litho Formulation Example 1 was coated and baked at 200° C. for 90 seconds on a silicon wafer. Then a 190 nm thick T83472 photoresist solution was coated and baked at 115° C. for 60 seconds. The wafer was then imagewise exposed using a Nikon NSR-306D 193 nm scanner with 0.85 NA, under dipole Y illumination of 0.9 sigma with PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns showed no standing waves, no footing and no scumming, indicating efficacy of the bottom anti-reflective coating.

Litho Performance Evaluation of Litho Formulation Example 2

The performance of the anti-reflective coating formulation from Litho Formulation Example 2 was evaluated using T83472 photoresist (product of AZ Electronic Materials USA Corp., Somerville, N.J.). About 140 nm thick film of Litho Formulation Example 1 was coated and baked at 200° C. for 90 seconds on a silicon wafer. Then a 190 nm thick T83472 photoresist solution was coated and baked at 115° C. for 60 seconds. The wafer was then imagewise exposed using a Nikon NSR-306D 193 nm scanner with 0.85 NA, under dipole Y illumination of 0.9 sigma with PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns showed no standing waves, no footing and no scumming, indicating efficacy of the bottom anti-reflective coating.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:
1. An antireflective coating composition comprising a polymer which does not contain an aromatic chromophore, and a thermal acid generator, where the polymer comprises a structural unit derived from a diacid, a triacid, a dianhydride or its corresponding tetraacid or a mixture thereof and a structural unit derived from a diol, a triol, a diepoxy containing compound, a triepoxy containing compound, or mixture thereof, wherein the polymer comprises a moiety 3 and further where the polymer comprises a repetitive unit of structure (1) or (2)

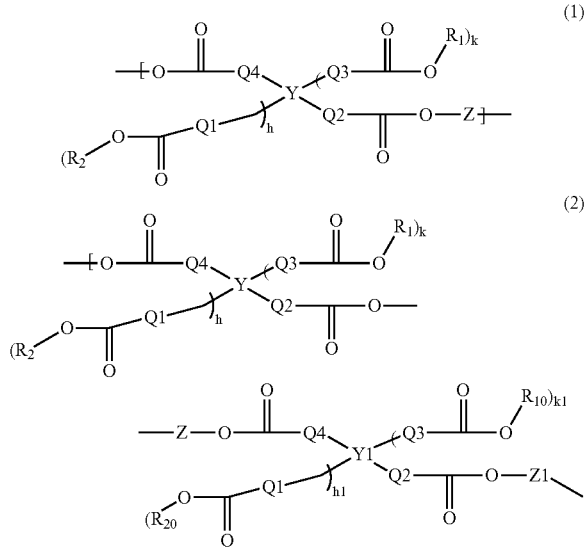

(1)

(2)

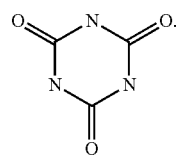

2. The antireflective coating composition of claim 1 wherein the composition further comprises an aromatic chromophore.

3. The antireflective coating composition of claim 1, further comprising a crosslinker.

4. The antireflective coating composition of claim 1 wherein h is 1 and k is 1.

5. The antireflective coating composition of claim 1 where Y is selected from unsubstituted or substituted $C_1$-$C_{20}$ alkylene, unsubstituted or substituted $C_1$-$C_{20}$ cycloaliphatic, and unsubstituted or substituted $C_1$-$C_{20}$ heterocycloaliphatic moiety.

6. The antireflective coating composition of claim 1 where Y is selected from

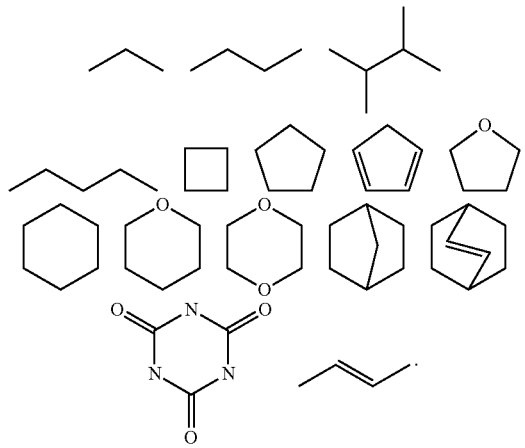

where each of Y and Y1 independently are a non-aromatic linking moiety; each of Z and Z1 independently are the structural unit derived from a group selected from a diol, a triol, a diepoxy containing compound, a triepoxy containing compound, a diepoxy compound containing a moiety 3 and a triepoxy compound containing a moiety 3; each of $R_1$ and $R_{10}$ independently are hydrogen or the structural unit derived from a monoepoxy containing compound; each of $R_2$ and $R_{20}$ are independently selected from structural unit derived from a diepoxy containing compound, structural unit derived from a triepoxy containing compound, structural unit derived from a diepoxy compound containing a moiety 3, and structural unit derived from a triepoxy containing compound-containing a moiety 3, provided an epoxy group is present such that the polymer is capable of forming a self crosslinked polyester; each of Q1, Q2, Q3, and Q4 are independently a direct bond or an unsubstituted or substituted $C_{1-4}$ alkylene; each of h and h1 are 1; and each of k or k1 independently are 0 or 1, wherein moiety 3 is 7. The antireflective coating composition of claim 1 wherein the polymer has a repetitive unit selected from

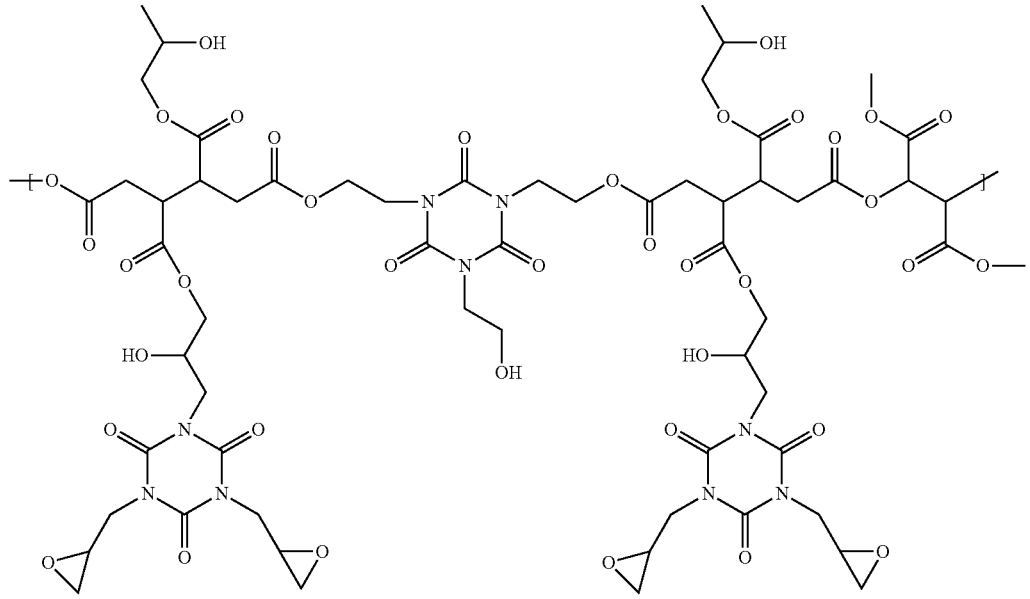

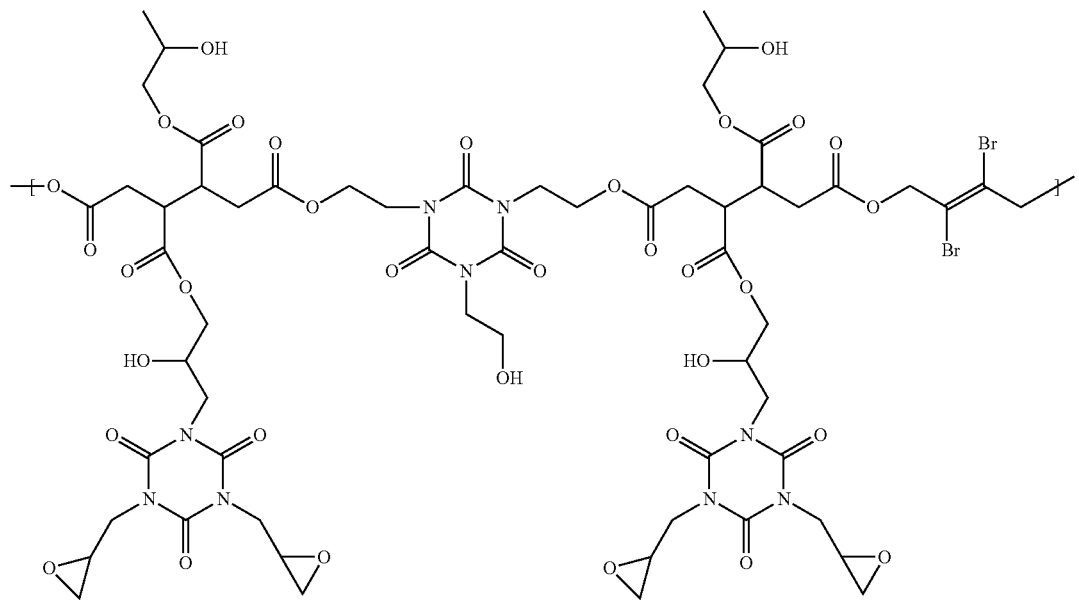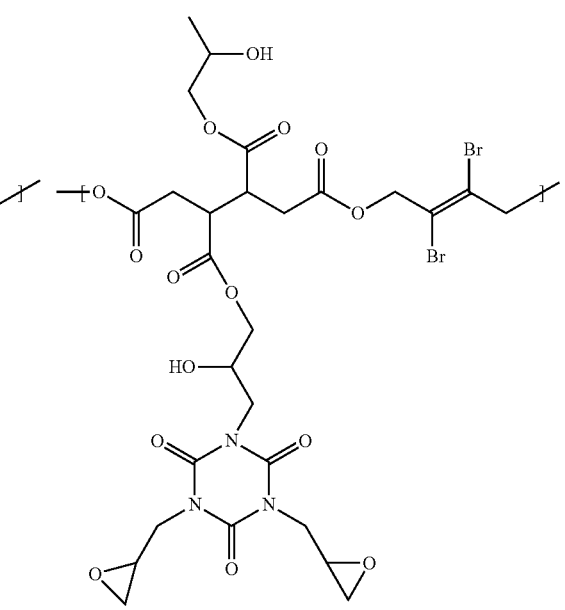

-continued

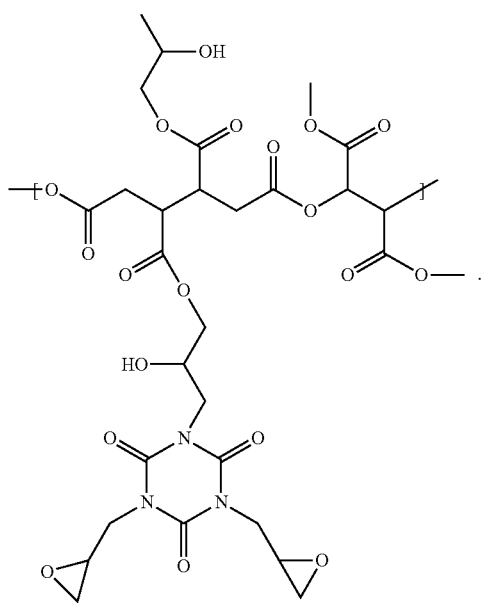

8. The antireflective coating composition of claim 1 where $R_1$ is the residue of a monoepoxy containing compound.

9. The antireflective coating composition of claim 1 which further comprises a solvent.

10. The antireflective coating composition of claim 9 where the solvent is selected from propylene glycol methyl ether, propylene glycol methyl ether acetate, cyclohexanone, 2-heptanone, ethyl 3-ethoxy-propionate, propylene glycol methyl ether acetate, ethyl lactate, gamma valerolactone, methyl 3-methoxypropionate, and mixtures thereof.

11. A coated substrate comprising a substrate having thereon an antireflective coating layer formed from the antireflective coating composition of claim 1, where the antireflective coating layer has an absorption parameter (k) in the range of $0.01 \leq k < 0.35$ when measured at 193 nm.

12. A process for forming an image comprising, a) coating and baking a substrate with the antireflective coating composition of claim 1; b) coating and baking a photoresist film on top of the antireflective coating; c) imagewise exposing to radiation the photoresist; d) developing an image in the photoresist; e) optionally, baking the substrate after the exposing step.

13. A process for patterning a substrate by lithography wherein, a bottom layer is formed on a substrate with the antireflective coating composition according to claim 1; an intermediate resist layer is formed on the bottom resist layer by using an intermediate resist layer composition containing silicon atoms; a top resist layer is formed on the intermediate resist layer by using a top resist layer composition of a photoresist composition, to form a trilayer resist film; a pattern circuit area of the top resist layer is exposed to radiation and then developed with a developer to form a resist pattern on the top resist layer; the intermediate resist layer is etched using as a mask the top resist layer on which the pattern is formed; the bottom resist layer is etched using as a mask at least the intermediate resist layer on which the pattern is formed; and then the substrate is etched using as a mask at least the bottom resist layer on which the pattern is formed, to form the pattern on the substrate.

14. The composition of claim 1, where the polymer comprises a moiety comprising a moiety 3 with an epoxy group.

* * * * *